(12) United States Patent
Masson et al.

(10) Patent No.: US 11,647,227 B2
(45) Date of Patent: May 9, 2023

(54) EFFICIENT TRANSFORMS AND TRANSPOSES FOR RATE-DISTORTION OPTIMIZATION AND RECONSTRUCTION IN VIDEO ENCODERS

(71) Applicant: NVIDIA Corporation, Santa Clara, CA (US)

(72) Inventors: Eric Masson, Fremont, CA (US); Ankur Saxena, San Jose, CA (US); Donald Bittel, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/403,054

(22) Filed: Aug. 16, 2021

(65) Prior Publication Data
US 2023/0062352 A1 Mar. 2, 2023

(51) Int. Cl.
*H04N 19/60* (2014.01)
*H04N 19/147* (2014.01)
*G11C 7/10* (2006.01)

(52) U.S. Cl.
CPC ........... *H04N 19/60* (2014.11); *H04N 19/147* (2014.11); *G11C 7/1051* (2013.01); *G11C 7/1078* (2013.01)

(58) Field of Classification Search
CPC .... H04N 19/60; H04N 19/147; H04N 19/625; H04N 19/61; H04N 19/15; G11C 7/1051; G11C 7/1078; G06F 17/16; G06F 17/14
See application file for complete search history.

(56) References Cited

U.S. PATENT DOCUMENTS 5,452,466 A * 9/1995 Fettweis ................. G06F 7/762
708/402
5,778,190 A * 7/1998 Agarwal ................ H04N 1/415
375/240.02

(Continued)

FOREIGN PATENT DOCUMENTS

CN 112866695 A * 5/2021

OTHER PUBLICATIONS

Grange; "VP9 Bitstream & Decoding Process Specification" Vre. 0.6, © Google, Mar. 31, 2016 (Year: 2016).*

(Continued)

*Primary Examiner* — Dramos Kalapodas
(74) *Attorney, Agent, or Firm* — Taylor English Duma L.L.P.

(57) ABSTRACT

Disclosed approaches may provide for non-blocking video processing pipelines that have the ability to efficiently share transform hardware resources. Transform hardware resources may be shared across processing parameters, such as pixel block dimensions, transform types, video stream bit depths, and/or multiple coding formats, as well as for inter-frame and intra-frame encoding. The video processing pipeline may be divided into phases, each phase having half-butterfly circuits to perform a respective portion of computations of a transform. The phases may be selectable and configurable to perform transforms for multiple different combinations of the processing parameters. In each configuration, the phases may be capable of performing a transform by a sequential pass through at least some of the phases resulting in high throughput. Approaches are also described related to improving the performance and efficiency of transpose operations of transforms.

26 Claims, 16 Drawing Sheets

(56) References Cited

U.S. PATENT DOCUMENTS

| | | | | |
|---|---|---|---|---|
| 9,451,250 | B2* | 9/2016 | MacInnis | H04N 19/61 |
| 10,448,053 | B2* | 10/2019 | Said | H04N 19/60 |
| 10,572,824 | B2* | 2/2020 | Chamberlain | G06F 21/85 |
| 2014/0337396 | A1* | 11/2014 | Symes | G06F 17/147 |
| | | | | 708/402 |
| 2016/0021369 | A1* | 1/2016 | Hampali | G06F 17/147 |
| | | | | 375/240.18 |
| 2018/0152732 | A1* | 5/2018 | Chen | H04N 19/423 |
| 2021/0385453 | A1* | 12/2021 | Sadafale | G06F 17/147 |

OTHER PUBLICATIONS

Adrian Grange et al., (hereinafter Grange); "VP9 Bitstream & Decoding Process Specification" Vre. 0.6, © Google, Mar. 31, 2016 (Year: 2016).*

Pastuszak, "Hardware architectures for the H.265/NEVC discrete cosine transform", In IET Image processing, vol. 9, 2015, No. 6, S . 468-477—ISSN 1751-9659, 10 pgs. (Year: 2015).*

Chen, et al.; "Efficient architecture of variable size HEVC 2D-DCT for FPGA platforms"; In International journal of electronics and communications—AEU, vol. 73, 2017, S. 1-8—ISSN 1434-8411, 8 pgs. (Year: 2017).*

"Alliance for Open Media", AV1 source code, Retrieved from the internet URL: https://aomedia.googlesource.com/aom/, accessed on Nov. 12, 2021, pp. 14.

"Chromium/webm/libvpx", VP9 source code, Retrieved from the internet URL: https://chromium.googlesource.com/webm/libvpx/, accessed on Nov. 12, 2021, pp. 3.

"H.265 : High efficiency video coding", International Telecommunication Union, Approved in Nov. 29, 2019, HEVC codec spec, Retrieved from the internet URL: https://web.archive.org/web/20210423192817/https://www.itu.int/rec/T-REC-H.265-201911-1/en, accessed on Nov. 12, 2021, p. 1.

"HEVC HM reference software", HEVC source code, Retrieved from the internet URL: https://vcgit.hhi.fraunhofer.de/ivet/HM, accessed on Nov. 12, 2021, pp. 3.

Grange, A., et al., "VP9 Bitstream & Decoding Process Specification", Version 0.6, Mar. 31, 2016, VP9 codec spec, Retrieved from the internet URL: https://storage.googleapis.com/downloads.webmproject.org/docs/vp9/vp9-bitstream-specification-v0.6-20160331-draft.pdf, accessed on Nov. 12, 2021, pp. 171.

Rivaz, P. D., and Haughton, J., "AV1 Bitstream & Decoding Process Specification", Version 1.0.0, Last modified: Jan. 8, 2019, AV1 codec spec, Retrieved from the internet URL: https://aomediacodec.github.io/av1-spec/av1-spec.pdf, accessed on Nov. 12, 2021, p. 681.

"NVIDIA Video Codec SDK", NVIDIA Developers, Retrieved from the internet URL: https://developer.nvidia.com/nvidia-video-codec-sdk, accessed on Nov. 12, 2021, pp. 15.

Pastuszak, "Hardware architectures for the H.265/NEVC discrete cosine transform", In IET Image processing, vol. 9, 2015, No. 6, S. 468-477—ISSN 1751-9659, 10 pgs.

Chen, et al.; "Efficient architecture of variable size HEVC 2D-DCT for FPGA platforms"; In International journal of electronics and communications—AEU, vol. 73, 2017, S. 1-8—ISSN 1434-8411, 8 pgs.

Masson, et al., First Office Action for German Patent Application No. 10 2022 120 207.0, filed Aug. 10, 2022, dated Feb. 1, 2023, 8 pgs. Note: English Translation Not Available.

* cited by examiner

| | PING | PONG | PING |
|---|---|---|---|
| WRITE BUFFER PIXEL BLOCK SIZE | 64x64 | 16x8 (OFFSET 0) 64x32 (OFFSET 2) | NONE |
| WRITE CYCLES FOR PIXEL BLOCK | 64 | 34 = 2 + 32 | 0 |
| READ BUFFER PIXEL BLOCK SIZE | EMPTY | 64x64 | 16x8 (OFFSET 0) 64x32 (OFFSET 2) |
| READ CYCLES FOR PIXEL BLOCK | 0 | 64 | 34 |
| MAX(WR CYCLES, RD CYCLES) | 64 = MAX(64,0) | 64 = MAX(34,64) | 34 = MAX(0,34) |

TOTAL CYCLES TO LAST PIXEL BLOCK EXIT = 64 + 64 + 34 = 162

FIGURE 9

EFFICIENT TRANSFORMS AND TRANSPOSES FOR RATE-DISTORTION OPTIMIZATION AND RECONSTRUCTION IN VIDEO ENCODERS

BACKGROUND

Critical to hardware video encoders is the implementation of efficient transforms between temporal and frequency domains. For video codecs, such as AV1 and VP9, forward and inverse transforms are essential to both rate-distortion optimization (RDO) and reconstruction (REC), with the transform operations separated by a memory intensive transpose operation. RDO may include optimizing rate-distortion to improve quality by testing different potential combinations of transform types, shapes, and/or sizes for encoding a superblock. REC may include using information from RDO to fine-tune selections and perform the encoding. The different transform types, shapes, and sizes that may be supported by a video codec can lead to a large search space for RDO. Due to the size of the search space, it may not be possible to evaluate all of the possibilities with hardware throughput dictating how many possibilities can be evaluated for a given superblock. However, achieving high throughput while supporting many different configurations and achieving an area and power efficient circuit is extremely challenging.

A conventional approach to video encoding may employ an iterative approach to performing transforms, in which further pixel input is blocked from entering the pipeline as the pipeline iterates on multiple passes of data. True multipliers are used to apply transforms which are costly in area, power, and timing, and therefore limit performance. Another conventional approach may iterate computations over several small functions to compose a larger function resulting in the overall transform. A considerable number of iterations may be needed and the resultant blocking can be many hundreds of cycles for larger transform sizes. Transpose may be performed using a physical transpose circuit that requires a large amount of resources. For these and other reasons, conventional approaches may require large and inefficient circuits as they are unable to scale well for high throughput.

SUMMARY

Embodiments of the present disclosure relate to efficient transforms and transposes for rate-distortion optimization and reconstruction in video encoders. Systems and methods are disclosed which may be used to provide high throughput video encoders or decoders with efficient usage of area and power.

Amongst other aspects of the disclosure, disclosed approaches may provide for non-blocking video processing pipelines that have the ability to efficiently share transform hardware resources. In at least one embodiment, transform hardware resources of a video processing pipeline may be shared across processing parameters, such as pixel block dimensions, transform types, video stream bit depths, and/or multiple coding formats, as well as for inter-frame and intra-frame encoding. The video processing pipeline may be divided into a plurality of phases, each phase having a plurality of half-butterfly (HB) circuits, adders, and/or subtractors operable to perform a respective portion of computations of a transform. The phases may be selectable and configurable to perform transforms for multiple different pixel block dimensions, transform types, video stream bit depths, and/or multiple coding formats, as well as for inter-frame and intra-frame encoding, allowing for high re-use of the transform hardware resources. In each configuration, the phases may be capable of performing a transform by a sequential pass through at least some of the phases resulting in high throughput.

BRIEF DESCRIPTION OF THE DRAWINGS

The present systems and methods for efficient transforms and transposes for rate-distortion optimization and reconstruction in video encoders are described in detail below with reference to the attached drawing figures, wherein:

FIG. 9 includes a table illustrating an example of how pixel blocks may be stored in the same buffer using offsets, in accordance with at least some embodiments of the present disclosure;

DETAILED DESCRIPTION

Figure 1:
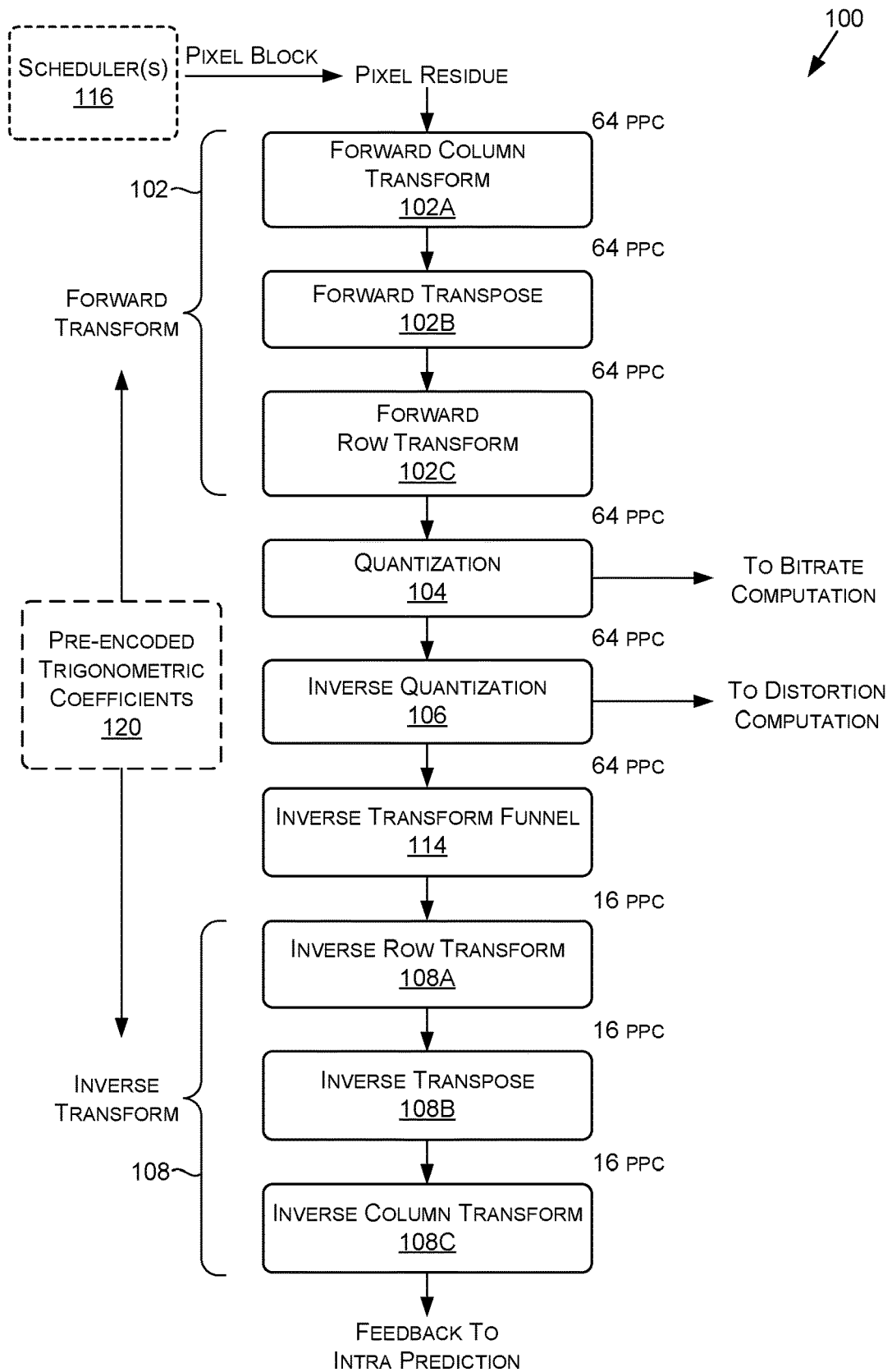
FIG. 1 illustrates an example data flow of a quantization and transform unit suitable for rate-distortion optimization and reconstruction of video, in accordance with some embodiments of the present disclosure.

Embodiments of the present disclosure relate to efficient transforms and transposes for rate-distortion optimization and reconstruction in video encoders. Systems and methods are disclosed which may be used to provide high throughput video encoders or decoders with efficient usage of area and power.

In contrast to conventional approaches, the present disclosure provides for transform pipelines that are capable of applying transforms to pixel blocks (which may also be referred to as a tile, a block partition, or a sub-block) with no blocking using no iterative passes on the pixels nor iterations over computational resources. The throughput PPC may be equivalent to the input PPC. These properties may exist for a variety of different processing parameters, such as pixel block dimensions, transform types, video stream bit depths, and/or multiple coding formats, as well as for inter-frame and intra-frame encoding. Providing a non-blocking design may result in high throughput and greatly simplify scheduling, allowing entities such as inter-frame and intra-frame encoding units to more easily share the same data flow 100.

Amongst other aspects of the disclosure, disclosed approaches may provide for non-blocking video processing pipelines that have the ability to efficiently share transform hardware resources. In at least one embodiment, transform hardware resources of a video processing pipeline may be shared across processing parameters, such as pixel block dimensions, transform types, video stream bit depths, and/or multiple coding formats, as well as for inter-frame and intra-frame encoding. The video processing pipeline may be divided into a plurality of phases, each phase having a plurality of half-butterfly (HB) circuits, adders, and/or subtractors operable to perform a respective portion of computations of a transform. The phases may be selectable and configurable to perform transforms for multiple different pixel block dimensions, transform types, video stream bit depths, and/or multiple coding formats, as well as for inter-frame and intra-frame encoding, allowing for high re-use of the transform hardware resources. In each configuration, the phases may be capable of performing a transform by a sequential pass through at least some of the phases resulting in high throughput.

Disclosed pipelines may implement transform units (e.g., a forward transform circuit, an inverse transform circuit, etc.) using a half-butterfly network (including a plurality of HBs and a plurality of adders), followed by a transposition, and another half-butterfly network (including a plurality of HBs). As used herein, a half-butterfly network may refer to circuitry including one or more half-butterfly circuits used perform at least a portion of a transform composition on coefficients. A half-butterfly or half-butterfly circuit may refer to a circuit configured to scale a linear combination of inputs (e.g., two inputs) by trigonometric values into a single output (e.g., using two multiples and an add as in FIG. 4A). Half-butterfly circuits may form smaller operations on pairs of inputs that can be networked to create a larger transform, as described herein.

In at least one embodiment, a half-butterfly may correspond to one of the outputs of a related pair in a butterfly processing flow (e.g., originating from fast Fourier Transforms (FFTs)) in which a pair of inputs are linearly combined to produce two outputs. For example, consider an abstraction of stage 5 of an FDCT16 transform in AV1 where the cospi[8] and cospi[40] values are known trigonometric constants:

```
out[4] = half_btf(cospi[56], in[4], cospi[8], in[7]) = cospi[56] * in[4] + cospi[ 8] * in[7]
out[5] = half_btf(cospi[24], in[5], cospi[40], in[6]) = cospi[24] * in[5] + cospi[40] * in[6]
out[6] = half_btf(cospi[24], in[6], -cospi[40], in[5]) = cospi[24] * in[6] + -cospi[40] * in[5]
out[7] = half_btf(cospi[56], in[7], -cospi[8], in[4]) = cospi[56] * in[7] + -cospi[8] * in[4]
```

As shown, the outputs 4 through 7 are linear combinations of inputs 4 through 7.

The terms can be rearranged as follows,

```
// A butterfly
out[4] = half_btf(cospi[56], in[4],  cospi[8], in[7]) = cospi[56] * in[4] +  cospi[ 8] * in[7]
out[7] = half_btf(cospi[56], in[7], -cospi[8], in[4]) = cospi[56] * in[7] + -cospi[ 8] * in[4]
// Another butterfly
out[5] = half_btf(cospi[24], in[5],  cospi[40], in[6]) = cospi[24] * in[5] +  cospi[40] * in[6]
out[6] = half_btf(cospi[24], in[6], -cospi[40], in[5]) = cospi[24] * in[6] + -cospi[40] * in[5]
``` where in[4] and in[7] are linearly combined to produce outputs out[4] and out[7], independent of all other inputs. Similarly, in[5] and in[6] are combined to produce out[5] and out[6]. One of the outputs of a related pair, such as out[5] from the out[5] and out[6] pair may refer to half of a butterfly processing flow, and may be implemented as a half-butterfly circuit. FFT's where pairs of inputs intermix to produce pairs of outputs may be considered of radix-2 type. Radix-2 may represent the algorithmic factor at which a larger FFT is divided and conquered into smaller FFTs. The disclosure also refers to radix formats, such as radix-4, which in contrast expresses the range of each digit in a number's representation.

In one or more embodiments, four high efficiency, transform units may operate at different throughputs scaling across 64 pixels-per-clock (PPC), 32 PPC and 16 PPC. For example, REC may operate at 32 PPC, with RDO operating at 64 PPC for forward transform and 16 PPC for inverse transform. The varying PPC across transform units can be tailored to the performance needs of each unit to converse circuit area and for efficiency.

An RDO throughput mismatch between the forward transform and the inverse transform may result from computing the relative costs of transforms for RDO in the frequency domain rather than the spatial domain. As a consequence, the inverse transform may only need to process a small fraction of the transforms executed in the forward domain and the average trial latency may be greatly reduced while the forward transform circuit yields higher performance. The PPC mismatch may allow for substantial area and power reduction in comparison to a uniform throughput because the inverse transform may support fewer pixel blocks types, such as only one transform type and size.

All transform trigonometric coefficients may be pre-encoded in sequential radix-4 format (or another number format). Pre-encoding may allow for the transform circuits to be implemented without any multipliers. For example, the transform circuits may rely only on multi add (or multi-adder) operations of minimal width where there is multi add used per half-butterfly. Rectangular scaling operations (e.g., of AV1) are also multiplier-less, such that an entire transform circuit may be multiplier-less.

A pipeline of a transform may share arithmetic logic across all transform types and sizes supported. ADST4 and IDT transforms may be mapped into HB operations while provably retaining bit accuracy. The HB networks may be chorded across the pipeline phases to minimize the total number of HB operations needed to perform a particular transform. Resources may be shared for the same maximal throughput across all transform types and sizes. For example, four 4×4 transforms can be processed in the same clock cycle of a 64 PPC implementation of a pipeline ($4\times4/64=1/4$), whereas a 32×32 transform may use 16 cycles ($32\times32/64=16$) per dimension.

Rounding and truncation operations for different coding formats, such as AV1 and VP9, may be merged into the high speed multi add circuits without need for separate processing circuitry, even where there are fractional precision differences between codecs. As such, a uniform pipeline may be provided where multiple codecs can be supported for their respective bit accuracies using shared HB, adders, and subtractors. Aspects of the disclosure also allow for sharing of resources between VP9 full precision ADST arithmetic and the corresponding AV1 truncated arithmetic. The multi add circuits may also include variable rounding position capabilities which may be used to reduce the output bit width of certain transform operations. For example, identity transform HB operations may exceed the bit width of HB operations found in other transforms without rounding accordingly.

In at least one embodiment, the inverse transform circuit for REC may be bit accurate for each supported coding format transform precisions (e.g., to both AV1 and VP9). Other transform circuits, such as for RDO or the forward transform circuit for REC may approximate the coding formats without retaining bit accuracy allowing for savings in area, power, and complexity. The overall bit precision needed at each phase may also minimized by propagating a wavefront of bit widths across all codecs, transform types and/or sizes that share resources, thereby leading to hardware of a minimal bit width in all computations—resulting in area and power savings.

Range clamping may be performed efficiently using a configurable circuitry sharing various possible ranges per clamping instance, accommodating different bit depths and/or codecs. To reduce latency, one or more pipeline stages may be skipped. A configuration circuit(s) may configure and select stages to allow for resource sharing using low power one-hot muxes with a low number of selection sources per mux. Sharing may be performed across a unified pipeline for multiple coding formats (e.g., both VP9 and AV1), all bit depths, all transform types and/or all transform sizes. As such, disclosed approaches may be used to easily scale to larger transform sizes that may arise in future codecs (128×128, 256×256, and beyond).

An improper transform size sequence may cause input blocking, albeit small using disclosed approaches. In at least one embodiment, blocking may be avoidable by tuning the depth of transpose buffers placed within a pipeline of sufficient throughput while processing transforms in an order of a primarily increasing size. In at least one embodiment, transpose operations may be performed using a FIFO-based approach allowing for fine grain tuning of transpose buffer sizes between transforms. Transpose buffer sizes may be adjustable, for example, in factors of the maximum transform size supported. Varying helical memory read and write patterns may be used to transpose transforms of all sizes using a mix of interleaving, de-interleaving and barrel shifting of the transform data. All transform sizes may be processed at maximum throughput, guaranteeing an efficiency matching the computational portions of transform.

Disclosed approaches further allowed for an N×N transform to be implemented with fewer than N independent memory units, such as logical RAMs. This reduction may be achieved, for example, using time multiplexing, write enables and excess bandwidth relative to transform size. As such, disclosed approaches may scale to future codecs with larger transform sizes. In one or more embodiments, an alternating scheme of read/write patterns may be used to save buffer space.

Some codecs, such as VP9, do not have a failsafe for heavily quantized streams, which can cause transform arithmetic to overflow during decode. Disclosed approaches may provide a safeguard by clamping and curtailing any drift error caused by streams that fall out of range. In at least one embodiment, a hardware-based error reporting mechanism may be provided that allowed for firmware to quickly retry encoding with less aggressive parameters. Overflow detection may be implemented in a transform unit without further propagating the detection issue to downstream units.

Disclosed embodiments may be comprised in a variety of different systems such as automotive systems (e.g., a control system for an autonomous or semi-autonomous machine, a perception system for an autonomous or semi-autonomous machine), systems implemented using a robot, aerial systems, medial systems, boating systems, smart area monitoring systems, systems for performing deep learning operations, systems for performing simulation operations, systems implemented using an edge device, systems incorporating one or more virtual machines (VMs), systems implemented at least partially in a data center, systems implemented at least partially using cloud computing resources, and/or other types of systems. While specific examples are provided, these example may be generalized beyond implementations details. For example, while disclosed approaches may be compatible with VP9 and AV1, other coding formats may be implemented. Additionally, while video encoding it primarily describes, aspects of the disclosure may be integrated into other types of pipelines, such as video decoders and/or other pipelines employing transforms and/or transposes.

With reference to FIG. 1, FIG. 1 illustrates an example data flow 100 of a quantization and transform unit suitable for rate-distortion optimization and reconstruction of video, in accordance with some embodiments of the present disclosure. It should be understood that this and other arrangements described herein are set forth only as examples. Other arrangements and elements (e.g., machines, interfaces, functions, orders, circuits, groupings of functions, etc.) may be used in addition to or instead of those shown, and some elements may be omitted altogether. Further, some of the elements described herein are functional entities or units that may be implemented as discrete or distributed components or in conjunction with other components, and in any suitable combination and location. Various functions described herein as being performed by entities or units may be carried out by hardware, firmware, and/or software. For instance, various functions may be carried out by a processor executing instructions stored in memory and/or one or more circuits.

The data flow 100 includes a forward transform 102, a quantization 104, an inverse quantization 106, and an inverse transform 108. The data flow 100 is illustrated using the example of RDO, but, as described herein, a similar data flow may be used for reconstruction. As indicated in FIG. 1, the forward transform 102 may operate on a sequence of tiles or pixel block (e.g., a partition of a superblock) in the form of residual pixels or residues, followed by the quantization 104, then the inverse quantization 106, and finally the inverse transform 108 to produce residual pixels of the pixel blocks. As described herein, not every pixel block may pass through all of the stages of the data flow 100 (e.g., for RDO). However, when the data flow 100 is used for intra-frame prediction in RDO, residual pixels from the inverse transform 108 may be used as feedback for certain pixel blocks. Also as shown, for RDO, outputs from the quantization 104 and the inverse quantization 106 may be used to compute bitrates and distortion of pixel blocks used to compute RDO metrics. Similar output may also be used to facilitate reconstruction.

As shown, the forward transform 102 includes a forward column transform 102A, a forward transpose 102B, and a forward row transform 102C. The inverse transform 108 includes an inverse row transform 108A, an inverse transpose 108B, and an inverse column transform 108C. When the data flow 100 is used for reconstruction, similar components may be included. However, those components may operate at a different PPC than what is shown in FIG. 1 (e.g., at a lower maximum PPC, such as a constant 32 PPC throughout the dataflow 100). Additionally, FIG. 1 shows an inverse transform funnel 114, which may not be used in the quantization and transform unit provided for reconstruction.

Resource Sharing Pipeline

The data flow 100 may be implemented with no blocking using no iterative passes on pixels nor iterations over computational resources. Thus, the throughput PPC may be equivalent to the input PPC. Providing a non-blocking design may greatly simplify scheduling, allowing for, amongst other benefits, inter-frame and intra-frame encoding units to more easily share the same data flow 100. However, providing such a non-blocking design with the ability to efficiently share the transform hardware resources for a variety of different processing parameters, such as pixel block dimensions, transform types, video stream bit depths, and/or multiple coding formats, as well as for inter-frame and intra-frame encoding is extremely challenging.

In accordance with one or more embodiments, a scheduler 116 may provide pixel blocks to the data flow 100 having a variety of different potential dimensions resulting in various shapes and sizes of residual pixel blocks (e.g., square and non-squares such as rectangles of different sizes). Examples include 64×64, 64×32, 32×64, 32×32, 32×16, 16×32, 16×16, 16×8, 8×16, 8×8, 8×4, 4×8, or 4×4, any of which may be processed by the data flow 100. In at least one embodiment, the scheduler 116 may represent any combination of circuitry that implements a scheduling strategy, such as generally providing pixel blocks to the data flow 100 that transition from smaller transform sizes to larger transform sizes. As described herein, some exceptions to the scheduling strategy may include sparingly inserting 16×16 transforms (the size of which may be different for different implementations of the pipeline) in RDO so that the feedback transforms have data ready back on time to prevent future gaps in scheduling. As a further example, the scheduler 116 may be implemented using a linear integer program.

The data flow 100 may also support multiple transform types, such as by way of example and not limitation, discrete cosine transform (DCT), identify transform (IDT), asymmetric discrete sine transform (ADST), and/or flip AST. Further the data flow 100 may support different potential video stream bit depths, such as by way of example and not limitation, 8, 10, and/or 12. The data flow 100 may also support multiple coding formats, such as by way of example and not limitation, AOMedia video 1 (AV1) and/or video predictor 9 (VP9).

In at least one embodiment, each process in the data flow 100 may correspond to a respective clock cycle. Thus, the data flow 100 may be nine clock cycles deep for RDO forward column transform and nine clock cycles deep for the row transform (excluding the latency of the transpose unit, which may vary according to transform size), and nine clock cycles deep for reconstruction. As shown, the data flow 110 for performs the forward column transform 102A, the forward transpose 102B, the forward row transform 102C, the quantization 104, and the inverse quantization 106 at the same PPC. In the present example, the PPC is 64 PPC, which may not be fast enough for each step to process certain pixel blocks completely in a single cycle, but allows for a smaller and more efficient hardware design. For example, a 4×4 pixel block may only need 16 PPC to be processed together in one cycle per step, but a 32×32 pixel block may need 1024 PPC to be processed in one cycle per step. Thus, the processing of a pixel block, such as one corresponding to more pixels than the PPC of the data flow 100, may be broken up over a number of cycles.

The forward column transform 102A of the forward transform 102 may perform a forward column transform on one or more columns of a pixel block. Processing may be performed on one or more columns of the pixel block. For example, for the forward column transform 102A may operate on all four columns of a 4×4 pixel block in a cycle. For a 32×32 pixel block, the forward column transform 102A may operate on a quantity of columns in a cycle, such that the total number of elements is less than or equal to the PPC. For example, two columns of a 32×32 pixel block may fit into the 64 PPC example. In one or more embodiments, the data flow 100 is configured to operate on as many columns and/or elements of a pixel block in a cycle that will fit into the PPC configuration. Further, portions of a pixel block may be processed serially through the steps of the data flow 100 (parallel processing may be used within steps). For example, after the first two columns of the 32×32 pixel block, the forward column transform 102A may operate on the next two columns of the 32×32 pixel block while the forward transpose 102B operates on the prior two columns of the 32×32 pixel block, with 16 cycles used for a step to process the full pixel block at 64 PPC.

The forward transpose 102B of the forward transform 102 may perform a forward transpose on a column(s) from the forward column transform 102A. For example, the forward transpose 102B may use a matrix transpose operation to shift the column(s) into a row(s). The forward row transform 102C may then perform a forward transform on the row(s). The inverse transform 108 may operate similar to the forward transform 102, but possibly with different PPC (e.g., for RDO as described herein).

As described herein, the data flow 100 may support a variety of different processing parameters, such as pixel block dimensions, transform types, video stream bit depths, and/or multiple coding formats. In at least one embodiment, one or more signals may be provided for a pixel block in order to configure the data flow 100 for processing the pixel block. In particular, the data flow 100 may support any of these various combinations of parameters using shared hardware, and signals may be provided to configure the hardware, such as to specify one or more pixel block dimension(s), transform type, bit depth, input format (e.g., whether an input is a row or a column), pixel block shape, and coding format. For example, the same transform network(s) may be used to process pixel blocks according to any combination of these various configurations.

Figure 2:
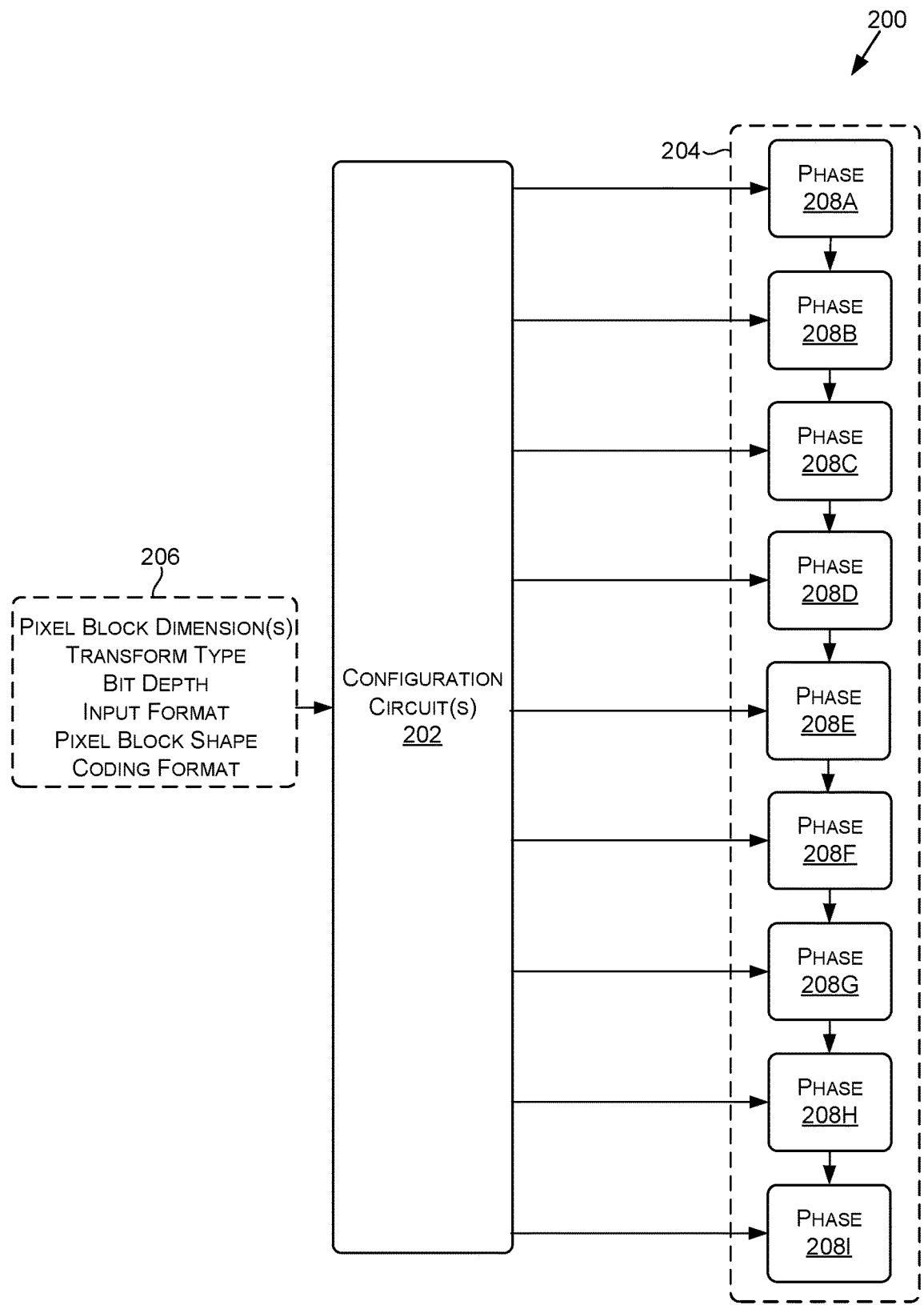
FIG. 2 illustrates an example of circuitry for sharing transform hardware resources, in accordance with some embodiments of the present disclosure.

Referring now to FIG. 2, FIG. 2 illustrates an example of circuitry 200 for sharing transform hardware resources 204, in accordance with some embodiments of the present disclosure. The circuitry 200 includes a configuration circuit(s) 202, which is operable to configure the transform hardware resources 204 according to one or more processing parameters 206. As shown, the transform hardware resources 204 includes multiple phases, such as a phase 208A, a phase 208B, a phase 208C, a phase 208D, a phase 208E, a phase 208F, a phase 208G, a phase 208H, and a phase 208I (which may be referred to collectively as "phases 208" or individually as "phase 208"). In at least one embodiment, respective transform hardware resources 204 may be provided for each transform. For example, while only one set of phases 208 is shown, transform hardware resources 204 may be provided for the forward transform 102 and the inverse transform 108 for both RDO and reconstruction (each of which may be configured by the configuration circuit(s) 202).

Transforms used to expresses a finite sequence of data points in terms of a sum of wave functions may be expressed as a sequence of stages. For example, the specification for DCT is expressed using ten computational stages. In at least one embodiment, each stage may be implemented as one or more half-butterfly operations and two (or more) operand add or subtract operations, even where the specification for the transform does not provide such as representation. In particular, each half-butterfly operation may include two multiplies and an add found in butterfly DCT (a*b+c*d). In at least one embodiment, the half-butterflies may be implemented in a multi add operation (comprising two multiplies and an adder), as described herein, by pre-encoding the trigonometry multiplicands.

In at least one embodiment, the configuration circuit 202 may configure which phase(s) 208 process which stage(s) and/or portion of a stage according to the processing parameters 206. For transforms that do not require each phase 208, the configuration circuit 202 may configure the transform hardware resources 204 to passthrough and/or bypass one or more of the phases 208. By mapping stages of transforms to one or more corresponding phases of the transform hardware resources 204 based on processing parameters 206, the configuration circuit 202 may determine which portions of the transform hardware resources 204 perform corresponding sequences of computations on pixel blocks, allowing for efficient sharing of the resources.

In at least one embodiment, each phase may include a network of half-butterflies operated in parallel and configured to perform at least a portion of the transform composition on coefficients of a pixel block (e.g., achieving results equivalent to matrix multiplication using a composition of functions). A phase may implement at least a portion of the half-butterfly operation(s) of a stage using a multi-add circuit(s) and without using multipliers. A multi-add circuit may include a binary adder at the end of the half-butterflies that propagates the bits from the least significant bit to the most significant bit when adding a pair of numbers to produce the output of a multi-add operation. Any suitable adder may be used, such as a ripple adder or a look-ahead carry adder. As described herein, only a single binary adder may be needed for each multi add operation (in embodiments that use multi-adders), which may occur after the multiple terms have been recombined into two operands. Further, the half-butterflies of the phases 208 may be agnostic to where they are placed in the data flow 100, allowing for great flexibility in the order and/or sequence the configuration circuit 202 assigns to a particular phase 208 in processing a transform.

In at least one embodiment, resources may be shared for the same maximal throughput across all supported transform types and sizes, all bit depths, and all coding formats. For example, four 4×4 transforms can be processed in the same clock cycle of the 64PPC pipeline (4×4/64=1/4), whereas a 32×32 transform may require 16 cycles (32×32/64=16) per dimension. In one transform instance, the number of instantiated half-butterflies may be 264 with 4224 multi-adds performed (e.g., using 264 multi-add circuits revisited when each column or row goes through the pipeline) for a full 2D DCT32 32×32 at 64PPC. This is minimal for a 64PPC throughput since there is at least one transform type, namely DCT32×32, which may need that many half-butterflies.

The configuration circuit(s) 202 may generally refer to any combination of circuitry capable of configuring the data flow 100 and/or the phases 208 (e.g., including centralized and/or distributed circuitry throughout the system which may or may not be integrated with other circuits). In at least one embodiment, data used to implement one or more aspects of the configuration may travel (e.g., as in-band packets) along with the data from the top of the pipeline. For example, the configuration may be issued upstream of the phases 208 and re-registered at each phase 208. This approach may simplify running two different phases 208 on different transform types. Having a local copy of configuration for each phase 208 may also reduce the load that the configuration circuit(s) 202 must drive, which in turn makes timing objectives easier to meet. For example, transform size and type may be transmitted along the pipeline with the coefficient data. This may allow for two or more different transform types flowing through the pipe at once. In at least one embodiment, one or more configuration aspects may be broadcast from a central configuration unit. For example, codec or coding format selection (e.g., of AV1 or VP9) may be sent directly to transpose circuitry without following the data through the pipe. This approach may be used to avoid passing the configuration data across the buffers (e.g., FIFO buffers) found in transpose.

Figure 3:
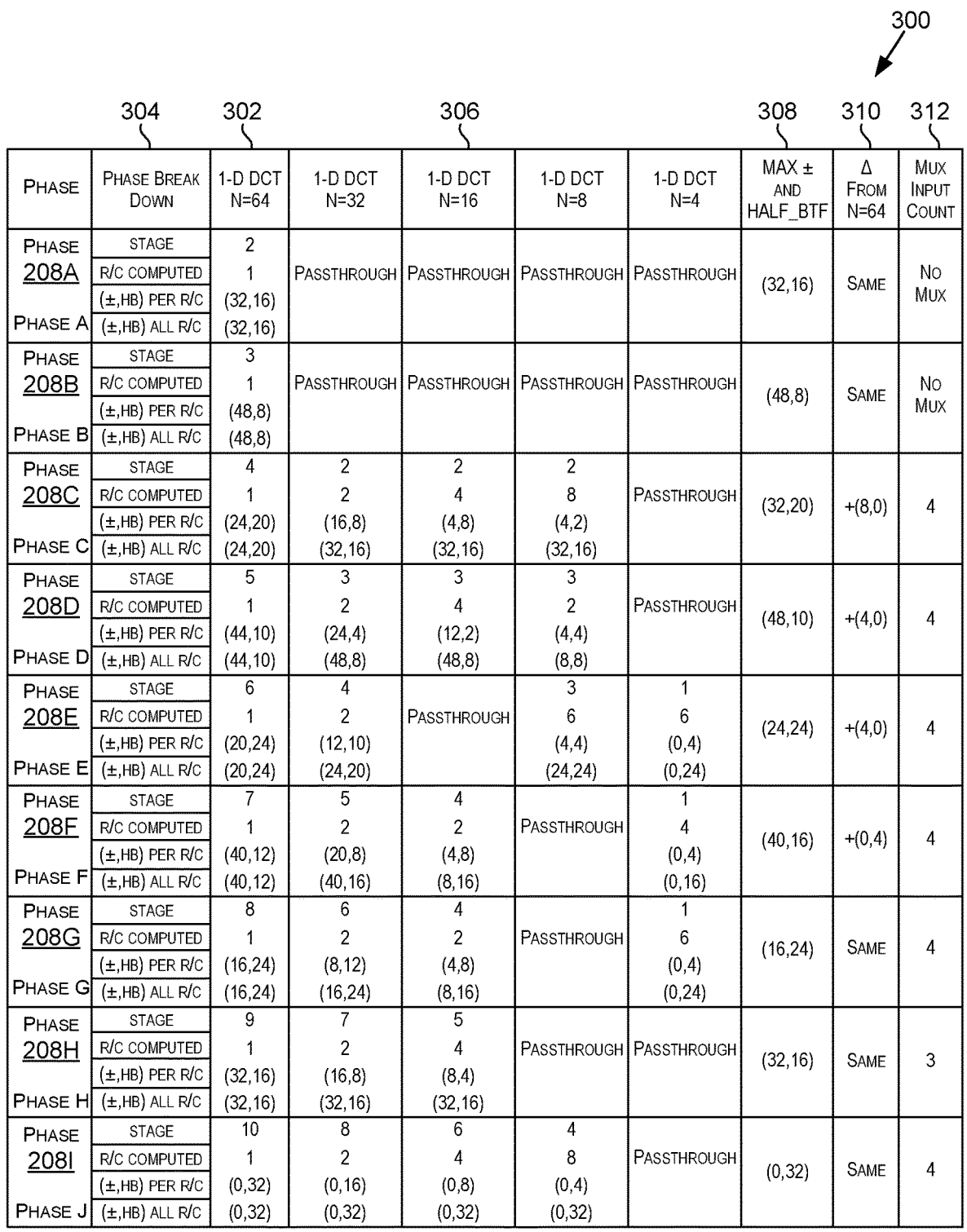
FIG. 3 illustrates an example of a table that reflects how transform hardware resources may be mapped to phases for a transform, in accordance with some embodiments of the present disclosure.

Referring now to FIG. 3, FIG. 3 illustrates an example of a table 300 that reflects how transform hardware resources may be mapped to phases for a transform, in accordance with some embodiments of the present disclosure. In at least one embodiment, the configuration circuit(s) 202 may be configured to map the transform hardware resources 204 to the phases 208 according to the table 300. By way of example and not limitation, the table 300 is for a 1-D DCT transform. However, similar mappings may be provided for other transforms.

In FIG. 3, N may refer to a dimension(s) of the pixel block to be processed using the transform hardware resources 204.

Thus, column 302 may reflect mapping information for a 64×64 pixel block. The column 304 provides different aspects of phase break down information provided for different pixel block dimensions. For example, the phase breakdown information for a phase and pixel block dimensions includes a stage that is mapped to the phase. Thus, stage 2 of the 1-D DCT is mapped to the phase 208A for a 64×64 pixel block. For other pixel block dimensions, the phase 208A may be used as a passthrough, as indicated in FIG. 3. Further, for some phases, a stage may be divided over multiple phases 208. For example, stage 4 may be provided over the phases 208F and 208G for a 1-D DCT 16×16, as indicated in column 306.

The phase breakdown information for a phase and pixel block dimensions also includes r/c computed, which indicates the number of rows or columns computed by the phase 208. For example, all of the phases 208 for a 64×64 pixel block are indicated in the column 302 as processing one row or column. In the phase breakdown information (±, hb) per r/c, ± indicates the number of adders per phase and hb indicates the number of half-butterfly-implemented multipliers per phase for each row or column. Thus, the phase 208D for a 64×64 pixel block may include 44 adders/subtractors (e.g., of two arguments) and 10 half-butterflies (e.g., each two multiplies and an adder, or multi-adder), as indicated in column 302. Similarly, in the phase breakdown information (±, hb) all r/c, ± indicates the total number of adders/subtractors per phase and hb indicates the total number of half-butterfly-implemented multipliers per phase for all rows or columns. All additions inside of a half-butterfly may be additions, with any negation handled through negative constant coefficients. In at least one embodiment, the binding of addition vs subtraction is not performed dynamically. Addition operations may only be shared with other addition operations, and subtraction operations with other subtraction operations without on-the-fly selection of addition vs subtraction for a resource. This approach may result in smaller, faster, and more power efficient hardware because the adder and subtractors are dedicated to one type of operation. This may also be achieved without requiring additional adder or subtractor resources due to a possible mismatch on a given phase 208.

Column 308 indicates the maximum number of adders and multipliers needed for each phase, and column 310 indicates the delta between the maximums relative to N=64 for DCT64. As indicated, the phase 208F may require a limited number of additional multipliers, indicating highly efficient sharing of resources. While mappings are shown for various dimensions, not all of the transform sizes need be implemented in the data flow 100. For example, in at least one embodiment, N=64 may not be used, with the maximum transform sizing being N=32. In such an example, the delta between the maximums relative to N=32 would be 0.

In at least one embodiment, the configuration circuit(s) 202 may configure inputs and outputs of the phases 208 for processing a particular transform using muxes between inputs and outputs of the half-butterflies. The phase breakdown information also includes column 312 indicating the number of mux inputs needed for the configuration circuit(s) 202 to implement the phase. As indicated, the mux input counts are minimal, which indicates the number of transforms a HB performs in a worst case scenario. However, other half-butterflies may require less muxing due to having fewer transforms. For various phases, no multiplexers are required, advantageously providing the adders with adding terms that are not muxed.

In at least one embodiment, muxes used by the configuration circuit(s) 202 to configure the transform hardware resources 204 may be implemented using hot selects, providing for a low power design. All muxing may be implemented using direct AND-OR expressions for high speed muxing with one-hot select. In additional to being fast, such muxes may produces 0 as a default value when no case is met and 0 may be the annihilator operation for multiplication and the identity operator for addition, making it an ideal default value for such implementation. Such a mux structure may also be have a low dependency on the selections totaling a natural power of two (2×1, 4×1, etc.) and may be efficient even when the selections do not number a natural power of two.

Transform Hardware Resource Sharing for ADST

The AV1 and VP9 codec standards do not specify ADST4 and IDT in terms of half-butterflies, making their hardware non-shareable with other transforms. Disclosed approaches provide for a mapping of ADST4 and IDT to half-butterflies or two operand add/subtract operations while retaining bit accuracy, allowing for those transforms to directly share hardware with other transforms, thereby avoiding a separate circuit path just for those transforms.

Various challenges arise when mapping ADST, examples of which are described with respect to ADST4. One issue is that ADST4 has more than four outputs on some computation stages. Other transforms DCT-N and ADST-N of size N have exactly N outputs. This makes flop management complicated and hardware sharing more difficult. Another issue is that all half-butterfly operations may round and truncate to keep bit-width of results in check. However, an ADST4 transform keeps the full width of its multiplication results until the last output stage (similar to VP9 ADST transforms of other sizes, which is not the case for AV1). Additionally, add and subtract operations can have three operands in ADST4. All other transforms may have two operand addition and subtraction and the bit-width of adders is much wider, because of the previous issue. Furthermore, the difference between forward and inverse transforms is typically a reversal of the stages. For ADST4, that does not hold and it is multiplier heavy in the early stage for both, requiring distinct designs for both. Also, line rate is difficult to achieve because of a high multiplier cost that cannot be shared with the hardware for other transforms.

To avoid various issues associated with ADST, conventional notions of ADST may be reformulated and refactored so that it can be expressed in a manner similar other transforms, therefore allowing resource sharing. For example, forward ADST4 (FADST4) may be expressed in terms of half-butterflies and two operand adders/subtractors.

TABLE 1 below highlights steps involved in refactoring FADST4:

| Step | Pseudo Code expressing vp9_fadst4 in transform_vp9.cpp in libav1 |
|---|---|
| 1 | // Define Ki = round[ (2/3)*sqrt(2)*sin( i*pi/9) ], 0<= i <= 4 where Ki <= cos(pi/18) < 1.0<br>// stage 0<br>// stage 1<br>x0 = input[0]<br>x1 = input[1]<br>x2 = input[2]<br>x3 = input[3]<br>// stage 2<br>s0 = K1*x0<br>s1 = K4*x0 |

TABLE 1-continued below highlights steps involved in refactoring FADST4:

| Step | Pseudo Code expressing vp9_fadst4 in transform_vp9.cpp in libav1 | |
|---|---|---|
| | s2 = K2*x1 | |
| | s3 = K1*x1 | |
| | s4 = K3*x2 | |
| | s5 = K4*x3 | |
| | s6 = K2*x3 | |
| | s7 = x0 + x1 − x3; | |
| | // stage 3 | |
| | t0 = s0 + s2 + s5 | |
| | t1 = K3*s7 | |
| | t2 = s1 − s3 + s6 | |
| | t3 = s4 | |
| | // stage 4 | |
| | y0 = t0 + t3 | |
| | y1 = t1 | |
| | y2 = t2 − t3 | |
| | y3 = t2 − t0 + t3 | |
| 2 | // Now expand t0,...,t3 and y0,...,y3 in terms of x0,...,x3 | |
| | // stage 3 | |
| | t0 = s0 + s2 + s5 | = K1*x0 + K2*x1 + K4*x3 |
| | t1 = K3*s7 | = K3*x0 + K3*x1 − K3*x3 |
| | t2 = s1 − s3 + s6 | = K4*x0 − K1*x1 + K2*x3 |
| | t3 = s4 | = K3*x2 |
| | // stage 4 | |
| | y0 = t0 + t3 | = K1*x0 + K2*x1 + K4*x3 + K3*x2 |
| | y1 = t1 | = K3*x0 + K3*x1 − K3*x3 |
| | y2 = t2 − t3 | = K4*x0 − K1*x1 + K2*x3 − K3*x2 |
| | y3 = t2 − t0 + t3 | = K4*x0 − K1*x1 + K2*x3 − K1*x0 − K2*x1 − K4*x3 + K3*x2 |
| 3 | // Reorganize the terms and recall that K0=0 | |
| | y0 = (K1*x0 + K2*x1) + ( K3*x2 + K4*x3) | |
| | y1 = (K3*x0 + K3*x1) + ( K0*x2 − K3*x3) | |
| | y2 = (K4*x0 − K1*x1) + (−K3*x2 + K2*x3) | |
| | y3 = ((K4−K1)*x0 + (−K2−K1)*x1) + (K3*x2 + (K2−K4)*x3) | |
| 4 | // Noting that K1 + K2 == K4 to simplify y3, even in approximated fixed point | |
| | // Arrange so that half operations are adders, half are subtractors like other transforms | |
| | y0 = (K1*x0 + K2*x1) + ( K3*x2 + K4*x3) | |
| | y1 = (K3*x0 + K3*x1) − ( K0*x2 + K3*x3) | |
| | y2 = (K4*x0 − K1*x1) − ( K3*x2 − K2*x3) | |
| | y3 = (K2*x0 − K4*x1) + ( K3*x2 − K1*x3) | |

The above table expresses FADST4 in terms of half-butterflies and two operand adders. The original VP9/AV1 code carries the full precision throughout the computations and only rounds and truncates after the final addition. However, a close approximation may suffice by carrying the round, truncating the half-butterflies, and clamping the adders at the end, as the difference in precision may be minor.

TABLE 2 below highlights an FADST implementation with half-butterflies and two operand adders:

```
// stage 0
// stage 1
stage++;
// trivial identity permutation - nothing done
x0 = input[0];
x1 = input[1];
x2 = input[2];
x3 = input[3];
// stage 2
stage++;
// Implement 8 half-butterflies on x0 and x1, keep x2 and x3 for next stage
half-butterflies
// Unlike other transforms this stage has more outputs than its 1-d transform size: 8 > 4=N.
```

TABLE 2-continued below highlights an FADST implementation with half-butterflies and two operand adders:

```
// The half-butterflies round and truncate because bit accuracy is not
crucial in RECON forward transform.
v0 = half_btf(sinpi[1], x0,  sinpi[2], x1, sin_bit);
v1 = half_btf(sinpi[3], x2,  sinpi[4], x3, sin_bit);
v2 = half_btf(sinpi[3], x0,  sinpi[3], x1, sin_bit);
v3 = half_btf(sinpi[0], x2,  sinpi[3], x3, sin_bit);
v4 = half_btf(sinpi[4], x0,−sinpi[1], x1, sin_bit);
v5 = half_btf(sinpi[3], x2,−sinpi[2], x3, sin_bit);
v6 = half_btf(sinpi[2], x0,−sinpi[4], x1, sin_bit);
v7 = half_btf(sinpi[3], x2,−sinpi[1], x3, sin_bit);
// stage 3
stage++;
// A regular adder stage with clamped values, no round and truncate since
already done in stage 2
// Here the number of adds matches the number of subtracts. Clamp size
to
be
determined by codec.
output[0] = clamp_value( v0 + v1, codec) ;
output[1] = clamp_value( v2 − v3, codec);
output[2] = clamp_value( v4 − v5, codec);
output[3] = clamp_value( v6 + v7, codec) ;
```

In at least one embodiment, all eight half-butterflies may be in one stage, as opposed to two half-butterflies in two stages, to reduce the number of extra outputs as quickly as possible, given that the second stage has eight outputs rather than four. This may also reduce the number of additional adders needed throughout.

Expressing inverse ADST4 in terms of half-butterflies and two operand adders/subtractors may be more complicated in order to match bit accuracy in reconstruction.

TABLE 3 below highlights steps involved in refactoring IADST4:

| Step | Pseudo Code expressing vp9_iadst4 in transform_vp9.cpp in libav1 | |
|---|---|---|
| 1 | // Define Ki = round[ (2/3)*sqrt(2)*sin( i*pi/9) ], 0<= i <= 4 where Ki <= cos(pi/18) < 1.0 | |
| | // stage 0 | |
| | // stage 1 | |
| | x0 = input[0] | |
| | x1 = input[1] | |
| | x2 = input[2] | |
| | x3 = input[3] | |
| | // stage 2 | |
| | s0 = K1*x0 | |
| | s1 = K2*x0 | |
| | s2 = K3*x1 | |
| | s3 = K4*x2 | |
| | s4 = K1*x2 | |
| | s5 = K2*x3 | |
| | s6 = K4*x3 | |
| | s7 = x0 − x2 + x3 | |
| | // stage 3 | |
| | t0 = s0 + s3 + s5 | |
| | t1 = s1 − s4 − s6 | |
| | t2 = K3*s7 | |
| | t3 = s2 | |
| | // stage 4 -- ignoring the clamp and round operation | |
| | y0 = t0 + t3 | |
| | y1 = t1 + t3 | |
| | y2 = t2 | |
| | y3 = t0 + t1 − t3 | |
| 2 | // Now expand t0,...,t3 and y0,...,y3 in terms of x0,...,x3 | |
| | // stage 3 | |
| | t0 = s0 + s3 + s5 | = K1*x0 + K4*x2 + K2*x3 |
| | t1 = s1 − s4 − s6 | = K2*x0 − K1*x2 − K4*x3 |
| | t2 = K3*s7 | = K3*x0 − K3*x2 + K3*x3 |
| | t3 = s2 | = K3*x1 |

TABLE 3-continued below highlights steps involved in refactoring IADST4:

| Step | Pseudo Code expressing vp9_iadst4 in transform_vp9.cpp in libav1 |
|---|---|
|  | // stage 4 -- ignoring the clamp and round operation<br>y0 = t0 + t3      = K1*x0 + K4*x2 + K2*x3 + K3*x1<br>y1 = t1 + t3      = K2*x0 − K1*x2 − K4*x3 + K3*x1<br>y2 = t2           = K3*x0 − K3*x2 + K3*x3<br>y3 = t0 + t1 − t3 = K1*x0 + K4*x2 + K2*x3 + K2*x0 −<br>K1*x2 − K4*x3 − K3*x1 |
| 3 | // Reorganize the terms and recall that K0=0<br>y0 = (K1*x0 + K4*x2) + (K3*x1 + K2*x3)<br>y1 = (K2*x0 − K1*x2) + (K3*x1 − K4*x3)<br>y2 = (K3*x0 − K3*x2) + (K0*x1 + K3*x3)<br>y3 = ((K1+K2)*x0 + (K4−K1)*x2) + (−K3*x1 + (K2−K4)*x3) |
| 4 | // Noting that K1 + K2 == K4 to simplify y3, even in approximated fixed point.<br>// Keep all as additions, these are wide adders that clamp, round & truncate. Not easily shared.<br>y0 = (K1*x0 + K4*x2) + ( K3*x1 + K2*x3)<br>y1 = (K2*x0 − K1*x2) + ( K3*x1 − K4*x3)<br>y2 = (K3*x0 − K3*x2) + ( K0*x1 + K3*x3)<br>y3 = (K4*x0 + K2*x2) + (−K3*x1 − K1*x3) |

TABLE 4 below highlights an IADST implementation with half-butterflies and two operand adders:

```
// stage 0
// stage 1
stage++;
// identity permutation - nothing done
x0 = input[0];
x1 = input[1];
x2 = input[2];
x3 = input[3];
// stage 2
stage++;
// Implement 8 half-butterflies on x0 and x1, keep x2 and x3 for next stage
half-butterflies
// Unlike other transforms this stage has more outputs than its 1-d transform size: 8 > 4=N.
// The half-butterflies round and truncate because bit accuracy is not crucial in RECON forward transform.
v0 = half_btf(sinpi[1], x0,  sinpi[2], x1, sin_bit);
v1 = half_btf(sinpi[3], x2,  sinpi[4], x3, sin_bit);
v2 = half_btf(sinpi[3], x0,  sinpi[3], x1, sin_bit);
v3 = half_btf(sinpi[0], x2,  sinpi[3], x3, sin_bit);
v4 = half_btf(sinpi[4], x0,−sinpi[1], x1, sin_bit);
v5 = half_btf(sinpi[3], x2,−sinpi[2], x3, sin_bit);
v6 = half_btf(sinpi[2], x0,−sinpi[4], x1, sin_bit);
v7 = half_btf(sinpi[3], x2,−sinpi[1], x3, sin_bit);
// stage 3
stage++;
// A regular adder stage with clamped values, no round and truncate since already done in stage 2
// Here the number of adds matches the number of subtracts. Clamp size
to
be
determined by codec.
output[0] = clamp_value( v0 + v1, codec);
output[1] = clamp_value( v2 − v3, codec);
output[2] = clamp_value( v4 − v5, codec);
output[3] = clamp_value( v6 + v7, codec);
```

The full precision half-butterflies can be made to be shared with the half-butterfly operations that also round and truncate. Before truncation and rounding, the full precision output may be computed. A special version of the truncation and round half-butterfly can be implemented so that the full precision output is produced as a second output. Furthermore, a single input rounding mode selection bit can be provided, also at little cost. With these added features the half-butterflies if IADST4 can be shared with those of other transforms.

Pre-Computed Trigonometric Coefficients

Implementing multiplication using a multiplier is typically hardware intensive. Disclosed approaches allow for a multiplier-less implementation of the data flow 100. For example, no multipliers may be needed to perform transforms for both rectangular scaling and half-butterflies. For rectangular scaling, the operation may be reduced to a multi add. Half-butterflies may also be implemented as multi add operations (e.g., one per half-butterfly), and may emulate two multiplies and an addition without using multipliers. For the half-butterflies, conventionally, in order to apply a particular transform, a real multiplier is required in order to encode the trigonometric coefficients for the multiplicand in radix-4, radix-8, or other number format to tabulate the addition coefficients for the transform. Amongst other problems, this process requires slow and large XOR gates.

As indicated in FIG. 1, and in accordance with aspects of the disclosure, pre-encoded trigonometric coefficients 120 of the transforms may be provided, for example, in radix-4 format. While radix-4 format is described, other transform formats may be suitable, such as radix-8 or Booth formats. For example, a signed radix-4 format may represent the numbers $\{0, 1, 2, 3\}$ as $\{-2, -1, 0, 1, 2\}$. Rather than performing full scale multiplication operations within the half-butterfly, to generate the multiplication terms of the half-butterfly operation the pre-encoded trigonometric coefficients 120 (e.g., pre-encoded signed radix-4 trigonometric coefficients 120) may be used, such that only a high speed addition it required to complete the operation (e.g., in a single cycle). As such, the half-butterfly operation may only require a single binary adder at the end to generate the output. Furthermore, serial radix four encoding may be used as opposed to parallel encoding to save 1 bit of width in the operation. In particular, 1 bit of width may be lost because the cosine/sine have an even number of bits in AV1/VP9. In other cases it is possible to lose one addition term instead (e.g., while still using serial coding).

In at least one embodiment, the pre-encoded trigonometric coefficients 120 may be stored on-chip using any suitable approach (computed on-chip or externally) and the appropriate set of coefficients for a transform may be selected by the configuration circuit 202 according to the processing parameters 206. By way of example and not limitation, for AV1 and VP9 implementations, 12-bit AV1 and 14-bit VP9 cosine and sine tables may be converted in-advance into radix-4. When a one-dimensional transform supports both AV1 and VP9, a 14-bit representation of AV1 may be used instead of a 12-bit representation so that AV1 and VP9 can share the same half-butterfly logic depending on the codec in use.

Excluding constants, using 12-bit precision trigonometry translates to 7 digit radix-4 numbers of 20 bits (six numbers of 3 bits (−2, −1, 0, +1, +2), and one 2 bit leading number (−1, 0, +1), whereas 14-bit precision requires 8 digit radix-4 numbers of 23 bits (six numbers of 3 bits, and one 2 bit leading number). Table 5 below provides some examples of cosines expressed in radix-4:

```
const TRIG_RADIX4_TABLE_DTYPEcos_radix4_table[COS_RADIX4_TABLE_SIZE] =
// HW14: 14 bits of precision in hardware
// Positive cos of precision 14 in HW precision 14, scale 1
// Offset=  0, 4^7=16384   4^7 4^6 4^5 4^4 4^3 4^2 4^1 4^0
...
, 0x403612 //              8 :   16069 = ( +1, +0, +0, -1, -1, +0, +1, +1)
, 0x41c8c4 //              9 :   15986 = ( +1, +0, -1, +2, +2, -1, +0, +2)
, 0x41c092 //             10 :   15893 = ( +1, +0, -1, +2, +0, +1, +1, +1)
...
// HW12 : 12 bits of precision in hardware
// Positive cos of precision 12 in HW precision 12
// Offset= 640, 4^6=4096   4^6 4^5 4^4 4^3 4^2 4^1 4^0
...
, 0x0806c2 //              8 :    4017 = ( +1, +0, +0, -1, -1, +0, +1)
, 0x083918 //              9 :    3996 = ( +1, +0, -1, +2, +2, -1, +0)
, 0x083812 //             10 :    3973 = ( +1, +0, -1, +2, +0, +1, +1)
```

Several transform types can share a same half-butterfly circuit. This may be accomplished, for example, by the configuration circuit 202 muxing which of the coefficients is in use at the time, as only one type of transform may be executing on a particular clock cycle.

Ignoring constant and rounding terms, each half-butterfly (X*cos A+Y*cos B) in AV1 12-bit trigonometry requires up to 14 additions terms: 7 for the left operand (X*cos A) and 7 for the right operand (Y*cos B). For 14-bit VP9 trigonometry the number of addition terms is 16 (also excluding constant and rounding terms). Each radix-4 digit represents an addition term, but the following observation can be made: each radix-4 coefficient term that is 0 represents one less term to add. Therefore, in at least one embodiment, in order to reduce area and power while improving timing the number of zero radix-4 coefficients may be maximized in the half-butterflies. In embodiments where a half-butterfly operation is shared across several transform types, an addition term may be eliminated by the configuration circuit 202 multiplexing trigonometric coefficients that all have 0 coefficients at similar positions.

TABLE 6 illustrates examples of addition terms with matching zeros:

```
// Offset= 640, 4^6=4096   4^6 4^5 4^4 4^3 4^2 4^1 4^0
, 0x0806c2 //              8 :    4017 = ( +1, +0, +0, -1, -1, +0, +1)
, 0x083918 //              9 :    3996 = ( +1, +0, -1, +2, +2, -1, +0)
, 0x083812 //             10 :    3973 = ( +1, +0, -1, +2, +0, +1, +1)
```

In the example of table 6, the 4^5 coefficients have a matching 0 for 4017, 3996 and 3973. Thus, all three of these inputs may be muxed together in a shared half-butterfly resulting in one less addition term in the shared multiplier.

Reduced PPC for Intra-Frame Prediction Feedback

Conventionally, after quantization and inverse quantization, a quantization and transform unit may convert the data from the frequency domain back into the spatial or time domain. RDO computations may then be performed using the data converted to the spatial domain, which may also be used as feedback for intra-frame prediction. Thus, an inverse transform may be performed on the data to compute the RDO. In order to maintain the PPC of the pipeline and simplify design, the inverse transform may be performed at the same PPC as the forward transform using the same hardware design.

Disclosed approaches may perform RDO computations (e.g., to compute RDO cost(s) for a pixel block) using data that is still in the frequency domain. Thus, an inverse transform does not need to be performed on the data to compute the RDO. Additionally, only a subset of pixel blocks the forward transform 102 is configured to operate on may be used to provide feedback for intra-frame prediction (e.g., used to compute approximate neighbors). Also, pixel blocks used to provide feedback for intra-frame prediction may be smaller than the largest pixel block the forward transform 102 is configured to operate on. For example, the inverse transform funnel 114 may filter out pixel blocks that are not used to provide the feedback. Thus, the inverse transform 108 may operate at a lower PPC than the forward transform 102, the quantization 104, and the inverse quantization 106, while other data may be fed into the data flow 100. Thus, the inverse transform 108 may be implemented using a smaller and lower-power design with reduced average latency.

In at least one embodiment, the scheduler 116 may be configured to provide pixel blocks to the data flow 100 that will not be blocked or stalled by the slower circuitry of the inverse transform 108. This may include the scheduler 116 selecting pixel blocks that do not need to be operated on using the inverse transform 108 (e.g., not used for feedback), and/or spacing out pixel blocks that do need to be operated on using the inverse transform 108 by at least a number of cycles needed to account for the difference in PPC as the inverse transform funnel 114 (e.g., with gaps corresponding to the processing speed ratio between the portions of the data flow 100, which may be approximately ¼ in the present example).

The inverse transform funnel 114 may select the subset of pixel blocks using various possible criteria. In at least one embodiment, the selection criteria may be based at least on one or more dimensions of a pixel block. For example, the inverse transform funnel 114 may be configured to select pixel blocks smaller than the largest pixel block the forward transform 102 is configured to operate on. In at least one embodiment, the inverse transform funnel 114 may only permit a pixel block of a particular sizes and/or dimensions to be operated on using the inverse transform 108. By way of example, and not limitation, the inverse transform funnel 114 may only permit 16×16 pixel blocks to be operated on using the inverse transform 108 (e.g., support only one transform type and size). Using the example of 16×16 pixel blocks, the boundary pixels of a pixel block may be of sufficient quality to provide as feedback for intra-frame prediction to use for subsequent transforms (which may be for different transform sizes) without requiring the inverse transform 108 to be performed on the largest size pixel block.

Further, the scheduler 116 may only need to space out 16×16 pixel blocks that are to be operated on using the inverse transform 108 by at least a threshold number of clock cycles to avoid stalling, while retaining flexibility in scheduling the remaining pixel blocks. For example, the scheduler 116 for an inter-frame encoding unit may provide pixel blocks to the data flow 100 when available without concern of blocking as its pixel blocks are not operated on using the inverse transform 108, so long as the scheduler 116 for the intra-frame encoding unit ensures pixel blocks that are operated on using the inverse transform 108 (e.g., the subset that correspond to upper and left boundaries used to determine another pixel block) are sufficiently spaced out to avoid blocking. In at least one embodiment, the scheduler 116 for each unit may provide blocks to the pipeline based at least on a small to big pixel block size order (e.g., all 4×4 followed by all 8×4, 4×8, 8×8, etc.), with some of the 16×16s out of order for application of the inverse transform 108. Thus, the units may share the pipeline without requiring a separate pipeline for each unit.

The inverse transform funnel 114 may be implemented using a circuit that transforms a large PPC input into a smaller PPC output. In at least one embodiment, the inverse transform funnel 114 is implemented using a first in, first out (FIFO) buffer. In the example of FIG. 1, the FIFO buffer may include three 64 PPC entries of four rows each and an output flop for a single 16PPC row. Where the output of the circuit is flopped, there may be a cycle delay from first in to first out. A flopped output may be desirable where the inverse row transform 108A is implemented using half-butterflies on the first cycle.

Variable Clamping and Precision of Adder Outputs

A transform may be implemented using a progression of successive networks, such as half-butterfly networks. Each successive network may cause bit gains due to the inclusion of addition and multiplication operations. For example, each time numbers are added a bit may be gained and multiplication may result in even more bit gain. While it would be desirable to impellent the steps of the data flow 100 at infinite precision, for practical purposes, such as to limit the size of the circuit design, the number of bits used to represent inputs and outputs of computations may be curtailed. Thus, clamping and rounding may be used to limit precision and curtail bit growth.

In order for the data flow 100 to produce conforming video streams, the video streams should be decoded identically at any destination. To achieve this, inverse transform designs must be computationally bit accurate to the codec specification(s) being employed. It may be desirable to support bit depths of 8, 10 or 12, each requiring different clamping ranges across the computations. These ranges may be different between different coding formats, such as AV1 and VP9, therefore allowing as many as six clamping cases on a particular operation. The clamping ranges themselves may also vary at different locations of the processing. Precision requirements between the coding formats may also be different. For example, some VP9 computations require up to 37 bits of full precision. Further, for ADST transforms the full VP9 precision needs to be carried across multiple steps.

In order to accommodate different bit depths and coding formats, conventional approaches may conduct arithmetic on hardware of the maximum sized expression across all transforms throughout a transform pipeline. Different fractional precisions used between VP9 and AV1 may be accounted inefficiently using separate shifting and rounding operations requiring extra computational steps as well as supplementary binary additions. Bit depth clamping to different ranges may be performed in a direct case-by-case manner. As such, the resulting design may not be conducive to scaling, high speed clocking, area friendliness nor brief latency.

In contrast to conventional approaches, disclosed approaches provide for variable bit width, precision, and rounding throughout the data flow 100, which can dramatically reduce circuit size and power consumption. While conventional approaches use the largest possible operator size throughout the pipeline, disclosed approaches may, as bits grow and propagate for each transform, only need to have the maximum size for a particular transform that is shared at a location in the pipeline (i.e., the minimal bit width needed for the supported transforms). Coding formats are typically specified with integer math. In accordance with aspects of the disclosure, clamping may be used after multiplication that is performed using fixed point precision math on integer inputs, allowing for at least some fractional precision to be dropped. Clamping may be accompanied by truncation to drop bits, as well as width rounding in order to maintain precision possible when dropping bits.

Range clamping may be efficiently performed using a configurable clamping circuitry (e.g., bound everywhere) sharing multiple possible ranges per clamping instance (e.g., all required ranges, such as 6 for 3 bit depths using AV1 and VP9), accommodating different bit depths and codecs. Using disclosed approaches, the overall bit precision needed at each stage may be minimized by propagating a wavefront of bit widths across all codecs, transform types and sizes that share resources, thereby leading to hardware of a minimal bit width in every computation.

Additionally, rounding and truncation for the supported coding formats may be merged into high speed multi add operations of the half-butterflies without need for separate steps while accounting for fractional precision differences between codecs. Thus, a uniform pipeline may be provided where each codec can be supported for its respective bit accuracies using shared half-butterflies, adders, and subtractors. Resources may be shared between VP9 full precision ADST arithmetic and corresponding AV1 truncated arithmetic. The multi add circuits may include a variable rounding position which may be used to reduce the output bit width of identity transform operations. Otherwise, identity transform half-butterfly operations may exceed the bit width of half-butterfly operations found in other transforms. In at least one embodiment, only one of the four transform units is bit accurate to both AV1 and VP9 transform precisions (the inverse transform 108 of reconstruction). Any of the three other transforms may approximate VP9 with AV1 allowing for savings of area, power, and complexity.

During transforms, clamps may be applied at the output of adders to keep bit growth in check as the transform progresses. These clamps may be referred to as "adder clamps" that may also round and truncate in addition to clamping. Furthermore, at the tail end of each 1D transform there may be circuits that remove precision by rounding, shifting and then clamping. The clamps on these circuits may be referred to as "round-shift clamps."

Rectangular and identity transforms involve similar scaling operations related to $\sqrt{2}$ and codecs specify them as separate scaling operations, each with their own rounding and truncation steps. Due to the nature of rounding and truncation, each operation may be implemented separately in order to be bit accurate, which would amount to a very large number of scaling multipliers and the area cost incurred to support these features would be high. Disclosed approaches may reuse existing resources, even if only for cases that need not be bit accurate.

In the cases the case that bit accuracy is needed, the scaling may be done in multiple explicit steps. Using disclosed approaches, for cases where bit accuracy is not needed, the steps may be merged into a single multiplication operation thereby reducing the hardware. On the input side of the inverse transform there may be a mux between a passthrough (1) and multiplication with a constant ($1/\sqrt{2}$) or ($\sqrt{2}$) rectangular scaling on the output side of the forward transform (there may be no bit growth when the multiplier is ($1/\sqrt{2}$) There may be no bit growth from the constant multiplier since $$\frac{1}{\sqrt{2}} < 1.$$

Finally, the output stage being a scaling from a power of two is a simple variable length shift left operation with five possible choices.

At a 64PPC throughput the number of additional multipliers needed for rectangular scaling may be on the order of 64. All the other multiplication resources (half-butterflies) can be in use. Consider the case where both 1-D transforms are DCT during a 32×16 rectangular transform. Most existing half-butterflies may be occupied for the DCT computations and therefore there may be little multiplication resources left to perform the rectangular scaling and any such resource would be very difficult to share. Therefore, in other disclosed approaches, a pipe stage may be added with 64 multipliers for 64 PPC or one of 32 multipliers for 32 PPC. Alternatively, these scalars may be merged into an existing pipe stage if the clock timing has sufficient slack. To improve on the area and timing, these additional multipliers may have one argument be constant $1/\sqrt{2}$ or ($\sqrt{2}$). Therefore, additional constant multipliers may be added for the purpose of rectangular scaling. In at least one embodiment, the constant multipliers may be implemented as multi adds and may use a stage different than those used for half-butterflies.

For IDT, using variable rounding positions allows identify transforms to be performed in the fractional part of the circuit to limit the number of integer bits on the output. For example, quarter rounding positions may be used in order to reduce the need for wider multi add circuits for the half-butterflies. In at least one embodiment, as opposed to rounding at the first point after the binary point, the $8^{th}$ point may be used saving 2 bits on the multiplier width in the end for IDT. This would be sufficient to avoid integer bit growth even for IDT64, which may be the largest such multiplier meaning it may be sufficient to handle all cases.

Figure 4A:
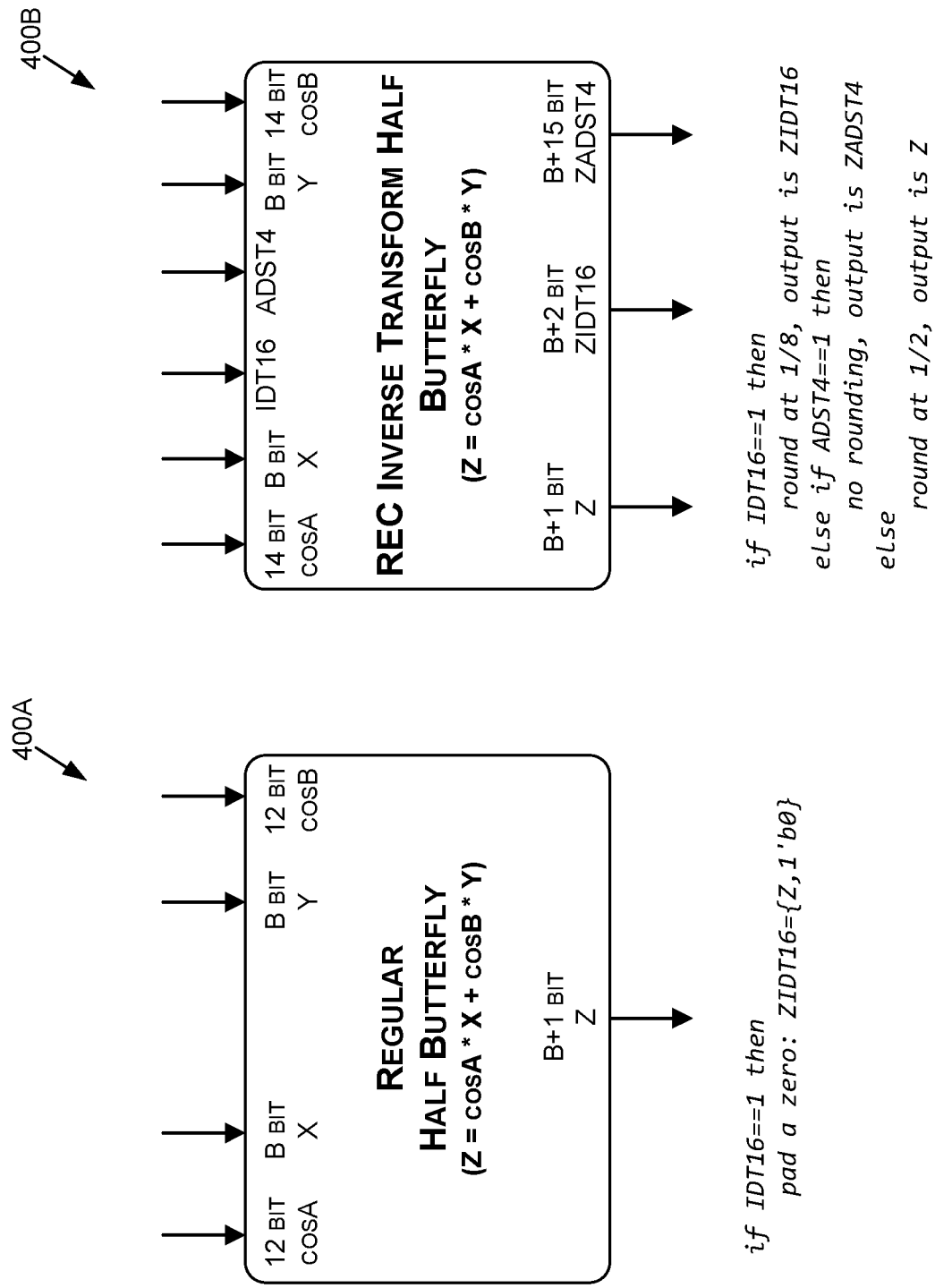
FIG. 4A illustrates examples of half-butterfly circuits that may be used to implement data flows, in accordance with some embodiments of the present disclosure.

Referring now to FIG. 4A, FIG. 4A illustrates examples of half-butterfly circuits 400A and 400B that may be used to implement the data flow 100, in accordance with some embodiments of the present disclosure. The half-butterfly circuit 400A may be used where bit accuracy is not necessary. By way of example and not limitation, the half-butterfly circuit 400A may be used to implement the forward transform 102 and the inverse transform 108 for RDO, as well as the forward transform 102 for reconstruction. The half-butterfly circuit 400B may be used where bit accuracy is necessary. By way of example and not limitation, the half-butterfly circuit 400B may be used to implement the inverse transform 108 for reconstruction. As indicated in FIG. 4A, bit accuracy for IADST4 may imply the full precision of the half-butterfly circuit must be carried out of the half-butterfly circuit for an extra output that keeps all the fractional bits of the multiply add (multi add) operation. Full precision may also imply no rounding on the output. Bit accuracy for IDCT16 may imply that the half-butterfly circuit must use a different subset of output bits than the regular half-butterfly circuit, as well as a different rounding position.

Overflow Handling and Error Resiliency

Some codecs, such as VP9, do not have a failsafe for heavily quantized streams, and this can cause the transform arithmetic to overflow during decode (violating the bit width rules) and lead to highly visible image corruption. If nothing is done, some hardware overflows cause large errors due to wraparound from positive to negative values or vice versa. Conventionally, some overflows may be detected by designing the circuit to produce a large error on the final output signal when such situations arise by corrupting corresponding pixels. Disclosed approaches may provide a safeguard from overflows by clamping and curtailing any drift error caused by streams that fall out of range thereby minimizing the error on the signal, producing a cleaner image. An efficient hardware error reporting mechanism may be implemented using interrupts so that firmware may quickly retry an encoding for that codec with less aggressive parameters. Additionally, formulae may be implemented to limit overflow detection to the transform unit without further propagating the detection issue to downstream units, which would otherwise occur.

In at least one embodiment, when any adder clamp of a transform unit applies a clamp, there may be an adder clamp overflow signal reported. Furthermore, at the tail end of each 1D transform there may be circuits that remove precision by rounding, shifting and then clamping. The clamps on these circuits may be referred to as "round-shift clamps." When round-shift clamps are applied, a round-shift clamp overflow signal may be reported. Each 1D transform may contribute both an adder clamp and round-shift clamp overflow signal. For example, RDO may include four 1D transforms, and therefore 4 adder clamp overflow and 4 round-shift clamp overflow signals may be generated, for a total of 8 overflow signals across RDO. Some of the overflow signals may be expected and therefore these signals may merely be used to report a status that may be ignored or masked. However, there are instances where overflows are never expected to occur on a legal video bit stream and in such cases the circuitry may be configured to generate an interrupt.

In each 1D transform there may be as many sources of adder clamp overflow as there are adders with clamps, so it can be hundreds when the PPC is large. For round-shift clamp overflow signals, there may be as many as the PPC (e.g., 64, 32 or 16 depending on the transform). In at least one embodiment, an interrupt may only be declared if the behavior of the hardware is unexpected and therefore undefined. For AV1, the clamps are specified directly in the protocol and therefore a clamp occurring may not result in an interrupt. For VP9, there are no clamps specified directly in the protocol, only checks that flag unexpected behavior in the design. Except for IDCT reconstruction, all VP9 1D transforms may be approximated with AV1 computations. As such, only the inverse row transform 108A and the inverse column transform 108C for reconstruction may implement real VP9 1D transforms. As such, those units may produce an interrupt on adder clamps and round-shift clamps when VP9 is being processed. Other overflows may be filtered off.

The VP9 codec specifies that no addition stage of the inverse transform (reconstruction IDCT) shall exceed 16 bits for a pixel stream of bit depth 8, none shall exceed 18 bits for a pixel stream of bit depth 10, and none shall exceed 20 bits for a pixel stream of bit depth 12. The same applies to the inverse quantization output (IQ). The inverse transform unit may detect such bit-width transgressions and report them via an interrupt. In at least one embodiment, overflow detection may be implemented based on detecting pre-defined cases. For example, at the end of each 1D transform pipeline there is a round shift operation, for both VP9 and AV1 to reduce the precision to a more manageable number of bits. The round shift at the end of the inverse transforms of reconstruction may be used to trigger interrupts. In at least one embodiment, overflows may be detected and interrupts triggered for particular combinations of overflow check bit widths C, quantities of bits to which round shift is applied S, and/or the incoming pixel value before the round shift. In is least one embodiment, particular C, S combinations may be respectively defined with one or more ranges of incoming pixel values that are to trigger an interrupt if present. Status bits may be used to determine which 1D transform circuit is the source of an unexpected interrupt and apply appropriate remedial actions. The same checks on C,S may limit over-flow checks to the transform block itself without placing a burden for additional overflow checks on downstream blocks that may otherwise be required for VP9.

Skipping Pipeline Stages

Latency of the transform and quantization unit may play an important role in reconstruction performance. In at least one embodiment, to improve the performance of transform, latency may be improved by skipping transform phases when smaller transforms are being processed by the data flow 100. For example, one or more ingress pipeline phases maybe bypassed or passed over. In at least one embodiment, the scheduler 116 and/or the circuit configuration that dic-tates various ready and valid signals according to the data flow may cause the circuitry to wait until one or more initial phases are empty, then provide the pixel block directly to the remaining one or more phases (e.g., the minimal number of phases) needed to accommodate processing of the pixel block without blocking. Also, in at least one embodiment, one or more egress pipeline stages maybe bypassed or passed through. In at least one embodiment, after fully processing a pixel block, the scheduler 116 and/or circuit configuration may cause the circuitry to wait until one or more remaining phases are empty, then empty out the current phase bypassing any remaining phases.

Figure 4B:
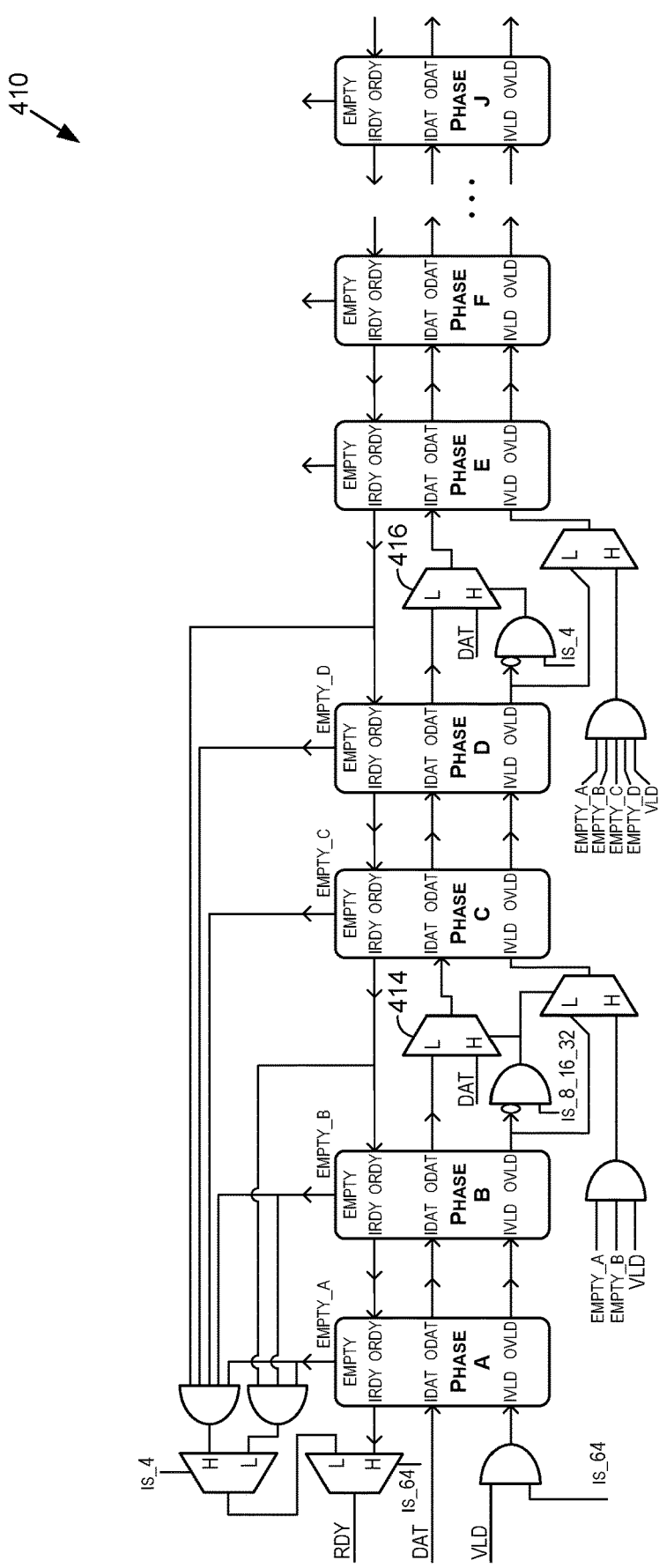
FIG. 4B illustrates an example circuit for bypassing ingress pipeline stages, in accordance with some embodiments of the present disclosure.
Figure 4C:
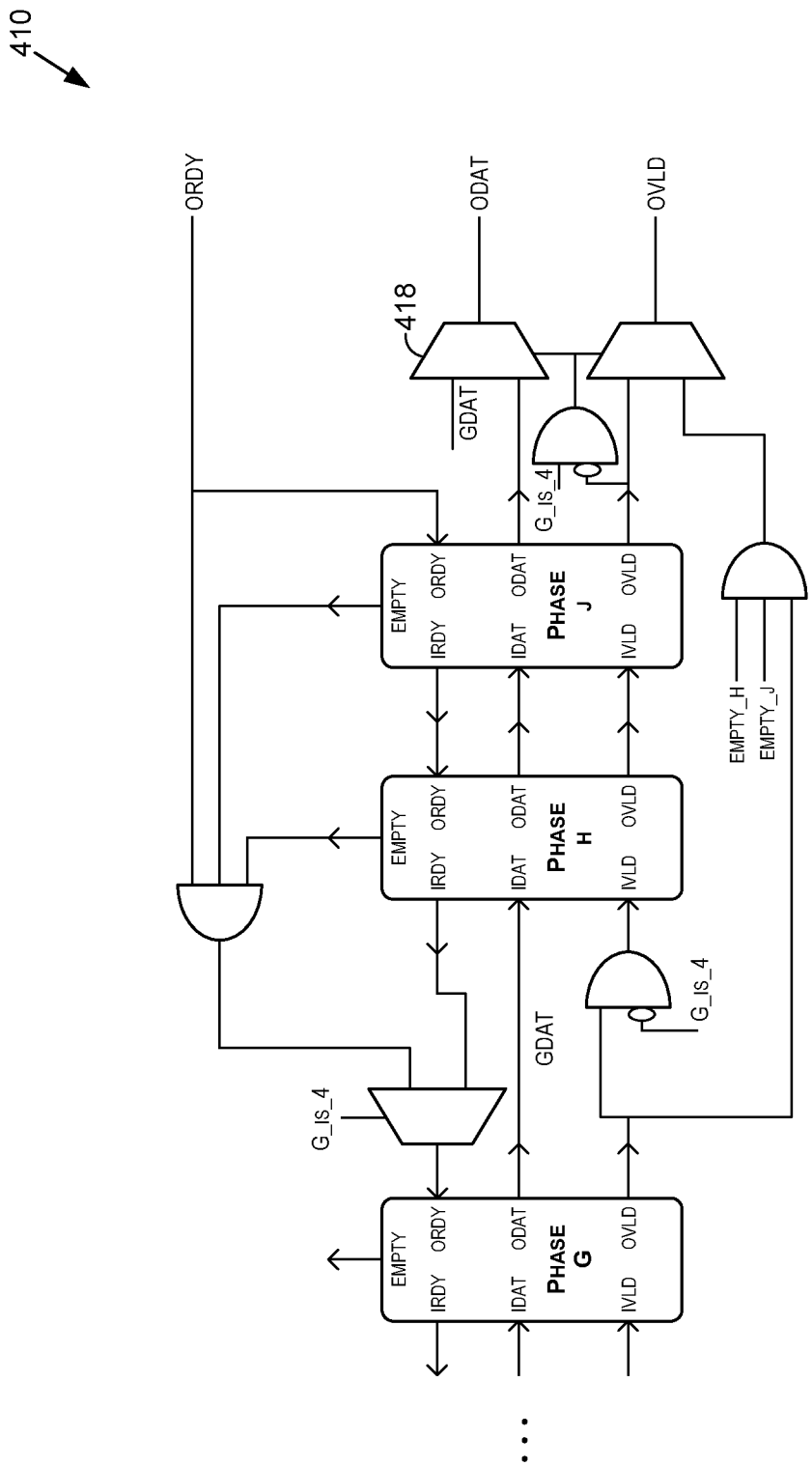
FIG. 4C illustrates an example circuit for bypassing egress pipeline stages, in accordance with some embodiments of the present disclosure.

FIG. 4B illustrates an example circuit 410 for bypassing ingress pipeline stages, in accordance with some embodi-ments of the present disclosure. FIG. 4C illustrates an example circuit 412 for bypassing egress pipeline stages, in accordance with some embodiments of the present disclo-sure. In FIGS. 4B and 4C, muxes 414, 416, and 418 may each be in the datapath and be multibit. In at least one embodiment, the bypassing may be used to conserve power (e.g., reduce flop energy consumption).

As indicated in FIG. 4B, if the incoming 1D DAT is size 4, the circuit 410 may wait until phases A through D are empty, then go to phase E while bypassing phases A-D. If the incoming 1D DAT is size 8, 16, or 32, the circuit 410 may wait until phases A and B are empty, then go to phase C while bypassing phases A and B. If the incoming 1D DAT is size 64, the circuit 410 may push data into phase A without bypassing any phases.

As indicated in FIG. 4C, if the incoming 1D DAT is size 4 at phase G, the circuit 410 may wait until phases H and J are empty, then bypass them. Otherwise, the circuit 410 may let the data pass through phases G, H, and J in sequence.

Transpose Unit Buffering

The transpose unit that implements the transpose opera-tions of the data flow 100 may be provided to account for variable latency with respect to transform size. For example, an improper transform size sequence can cause input block-ing. However, blocking is avoidable where the depth of the transpose buffers placed within a pipe have sufficient throughput. Also, the scheduler 116 providing transforms for processing in an order of a generally increasing size may mitigate blocking.

Figure 5:
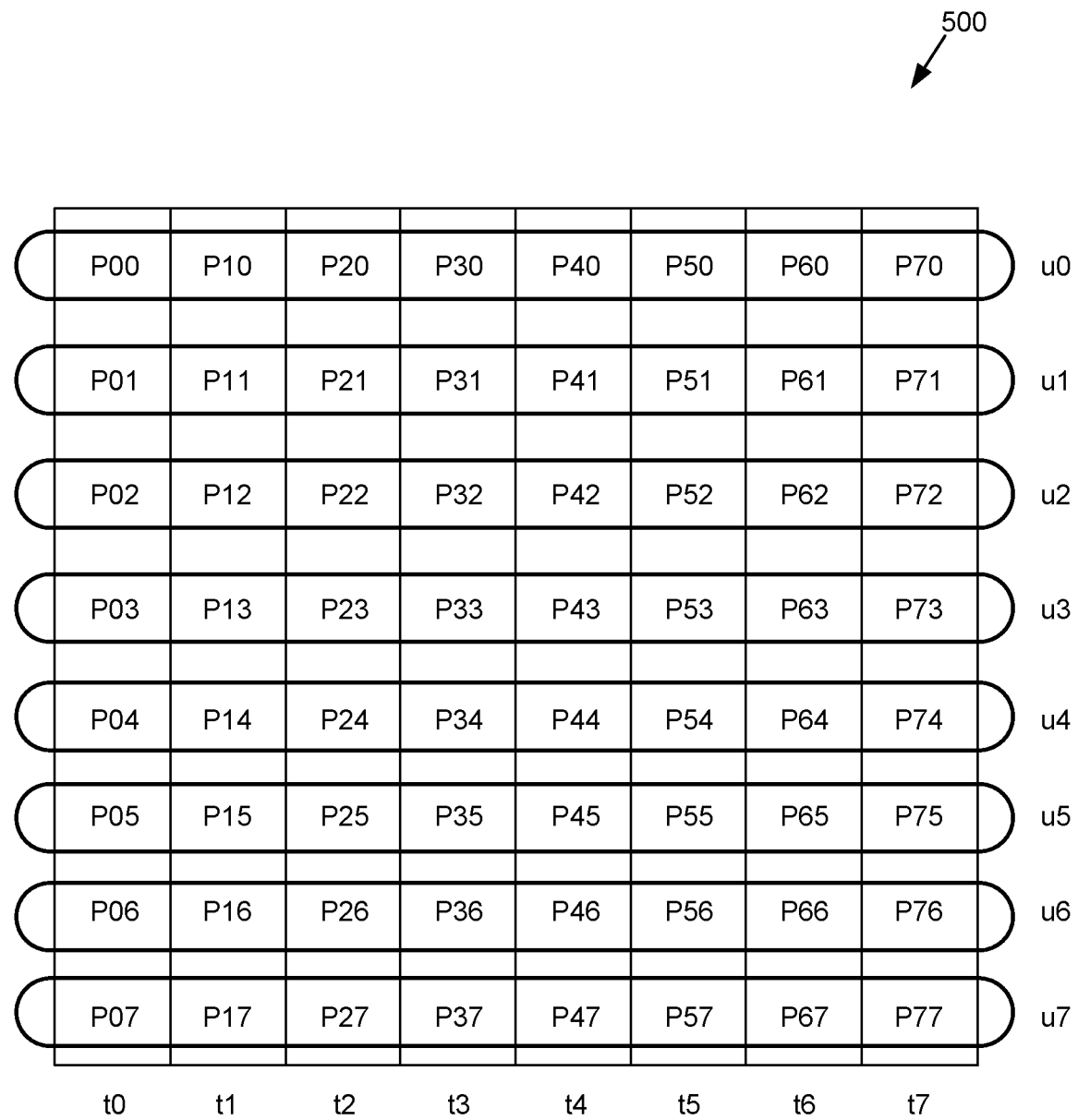
FIG. 5 depicts an example of aspects of a transpose operation for an 8×8 pixel block, in accordance with some embodiments of the present disclosure.

The forward transform transpose may take a set of column inputs and produce row outputs (and vice versa for the inverse transpose) allowing for resumption from one 1d operation to the next. FIG. 5 depicts an example of aspects of a transpose operation 500 for an 8×8 pixel block, in accordance with some embodiments of the present disclo-sure. The columns are shown to arrive over 8 cycles: a times t0, t1, t2, . . . , t7, where pixels P00 through P07 represent the first column arriving at time t0. Then they are read over eight cycles: a times u0, u1, . . . , u7, where at u0 the first row from P00 through P70 is read. For simplicity, the column and row coordinates (Pxy) may be used in discus-sion rather than linearly ordered pixel numbers from 0, 1, . . . , 63.

When a column is sent every cycle it may only be possible for the first row to be processed after the last column has arrived. Suppose a matrix Q that is N×N, follows P (an N×N pixel block being transposed from columns to row) into the transpose operation unit. Assume that there is no storage duplication, there are only $N^2$ pixels of storage to accom-modate the transpose operation and assume that Q follows the same fixed storage access pattern that P held. Then the first column of Q must wait until the last row of P is read out before data from Q can enter the transpose buffer. The forgoing indicates it may take at least N cycles after the first column arrives before rows can be issued since the arrival rate of columns may at best be one column per cycle, corresponding to the minimal latency from first column to first row of output. Furthermore, unless there is storage duplication then a transpose design may gave at least N cycles of stalls for the next block while the first block transpose is being read out.

An approach to remediating such stalls may be to dupli-cate the storage in a ping-pong buffer. In a traditional ping-pong buffer, there is one half of the buffer that is written while the other half can be read and vice versa on the next pass. The ping-pong buffer can mitigate stalling when the ordering of pixel block sizes is managed. However, the latency may remain 2N for an N×N block (N to write N columns, then N to read rows), which may be sufficient but could be improved as described herein.

The primary factor that dictates the size of the transpose buffer may be the maximum pixel block size tolerated in the pipeline. When giving examples, 64×64 will be discussed as he maximum pixel block size as it is the hardest case for AV1. However, any suitable maximum size may be used, such as 32×32, which can be inferred from the 64×64 case described herein.

The goal may be to process the transpose of a pixel block of 64×64 in the order of one column per clock cycle and follow with an output of one row per cycle giving a throughput of 1. This may be achieved with a large array of flops and muxing. However, RAMs (e.g., latch and flop based) may also be used for the transpose operation. For example, if each pixel is 20 bits then a ping-pong buffer would imply 2×64×64×20=163840 bits. This would repre-sent a significant flop count, and so RAMs may be used in some embodiments. In at least one embodiment, at least N RAMs may be used for an N×N pixel block. While RAMs are used in examples below, they may be generalized to memories or memory units.

Figure 6:
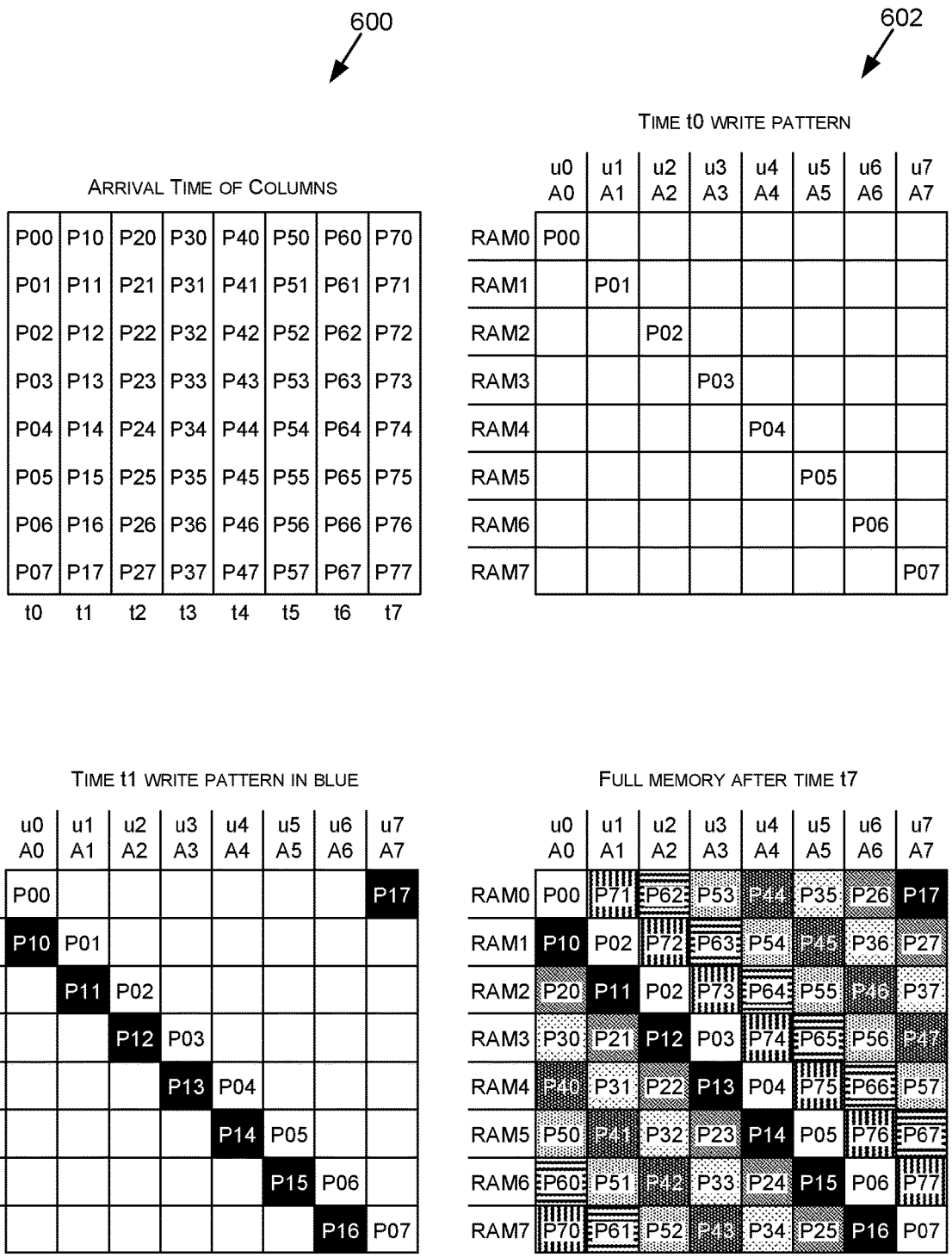
FIG. 6 illustrates an example of a helical memory access pattern for transposing pixel blocks, in accordance with at least some embodiments of the present disclosure.

Referring now to 6, FIG. 6 illustrates an example of a helical memory access pattern for transposing pixel blocks, in accordance with at least some embodiments of the present disclosure. The example is provided for an 8×8 transpose and may be suitable for a RAM access pattern with 8 RAMs, but can be generalized to different pixel block sizes and storage types. An array of 8 RAMs are shown totaling 8×8=64 entries, with each RAM having the same address depth or space. Further, the example, attempts to organize the written data so that reading all RAMs at address 0 provides row 0 at time u0, reading all RAMs at address 1 provides row 1 at time u1, and so on until all RAMs at address 7 provide row 7 at time u7. This property may be leveraged for elastic storage approaches, as described herein.

Diagram 600 illustrates arrival times of columns of pixels p00-p77 from time t0 to time t7 to memory, which may correspond to the memory access pattern illustrated using diagrams 602-604. The diagram 602 shows a write pattern for pixels p00-p07 time t0. The diagrams 602-604 illustrate storage addresses A0-A7 and storage units, or RAMs, RAM0-RAM7. At time t0, P00 is written in address A0 of RAM0 since it is on row 0. P01 is written in address A1 since it is on row 1, but RAM1 is used as the write port RAM0 may already busy at address A0, and so on until P07 is written in address A7 of RAM7 since it is on row 7. Diagram 604 shows a write pattern for pixel p10-p17 time t1. Here pixel p10 is stored in address A0 since it is on row 0, but in RAM1 since RAM0 may not available at address A0 (as it may be storing P00). Following this write pattern using the same pixel and address order, but with the RAM incremented for each column write, may result in the diagram 604, showing full memory after time t7. Diagrams 602-604 also show times u0-u7. Reading all RAMs at address A0 may give row 0, at time u0, reading all RAMs at address A1 may give row 1, at time u1, but with a circular shift of 1, and so on until address A7.

Figure 7:
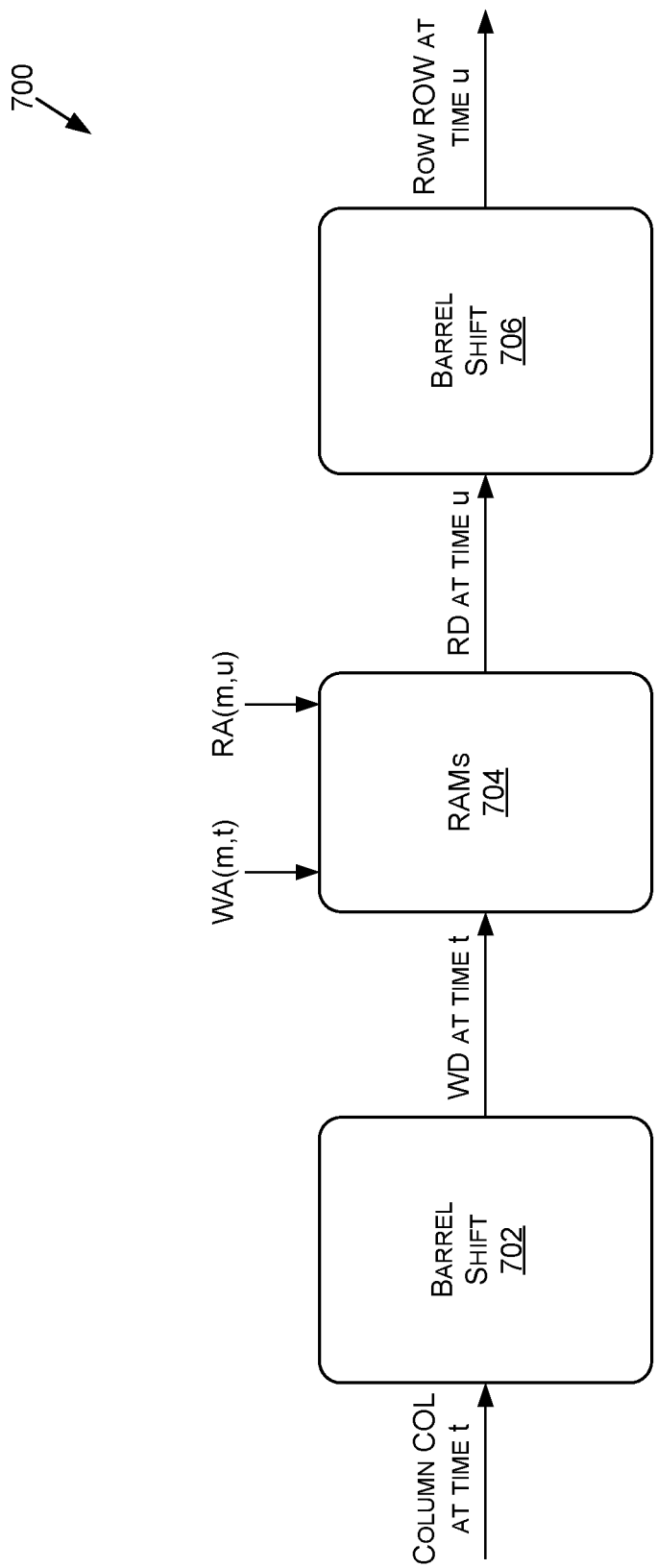
FIG. 7 is a flow diagram of an example of a process which may be used to implement the helical memory access pattern of FIG. 6, in accordance with at least some embodiments of the present disclosure.

In at least one embodiment, the memory barber pole or helix fill pattern of FIG. 6 may be implemented using barrel shifters to adjust for the circular shifts. Referring now to FIG. 7, FIG. 7 is a flow diagram of an example of a process 700 which may be used to implement the helical memory access pattern of FIG. 6, in accordance with at least some embodiments of the present disclosure. The process 700 may receive a column COL at time t and a barrel shift 702 may be performed on the column. In the 8×8 pixel block example, a barrel shift 8 may be performed. A write data WD may be performed at time t providing concatenated data for RAMs 704 (e.g., for eight dual port RAMs in this example. WA (m, t) indicates a RAM m write address provided to the RAMs 704 at time t and RA(m, u) indicates a RAM m read address provided to the RAMs 704 at time u. A read data RD may be performed at time u providing concatenated data for RAMs 704. The process 700 may provide a row ROW at time u using a barrel shift 706 (e.g., barrel shift 8).

Here the eight RAMs all have address depth 8 to transpose the 8×8. In at least one embodiment, to remediate stalls for ping-pong buffering, the buffer could be at least doubled. However, an alternative approach is to at least double the address space (from 8 to 16 in this example). For dual port RAMs it is possible to issue a read and a write operation on the same cycle. Using a conventional ping-pong, the bottom of the address space (0-7) may then be used for writing while the top part of the address space may be used for reading (8-15), and vice-versa when the next 8×8 pixel block comes. This may ensure there is never a read-write conflict to the same address and that the most significant bit for the write and read addresses are always opposite to each other. This way the number of RAMs can remain the same even after adding duplicate buffering. While in the present example, conflicts between the top and bottom halves of the address space may be avoided by using a first MSB for read addresses and a second MSB for write address this is not intended to be limiting, and many other approaches and configurations may be used to avoid such conflicts between the portions of the address space.

Reducing RAM Count and Area

Figure 8A:
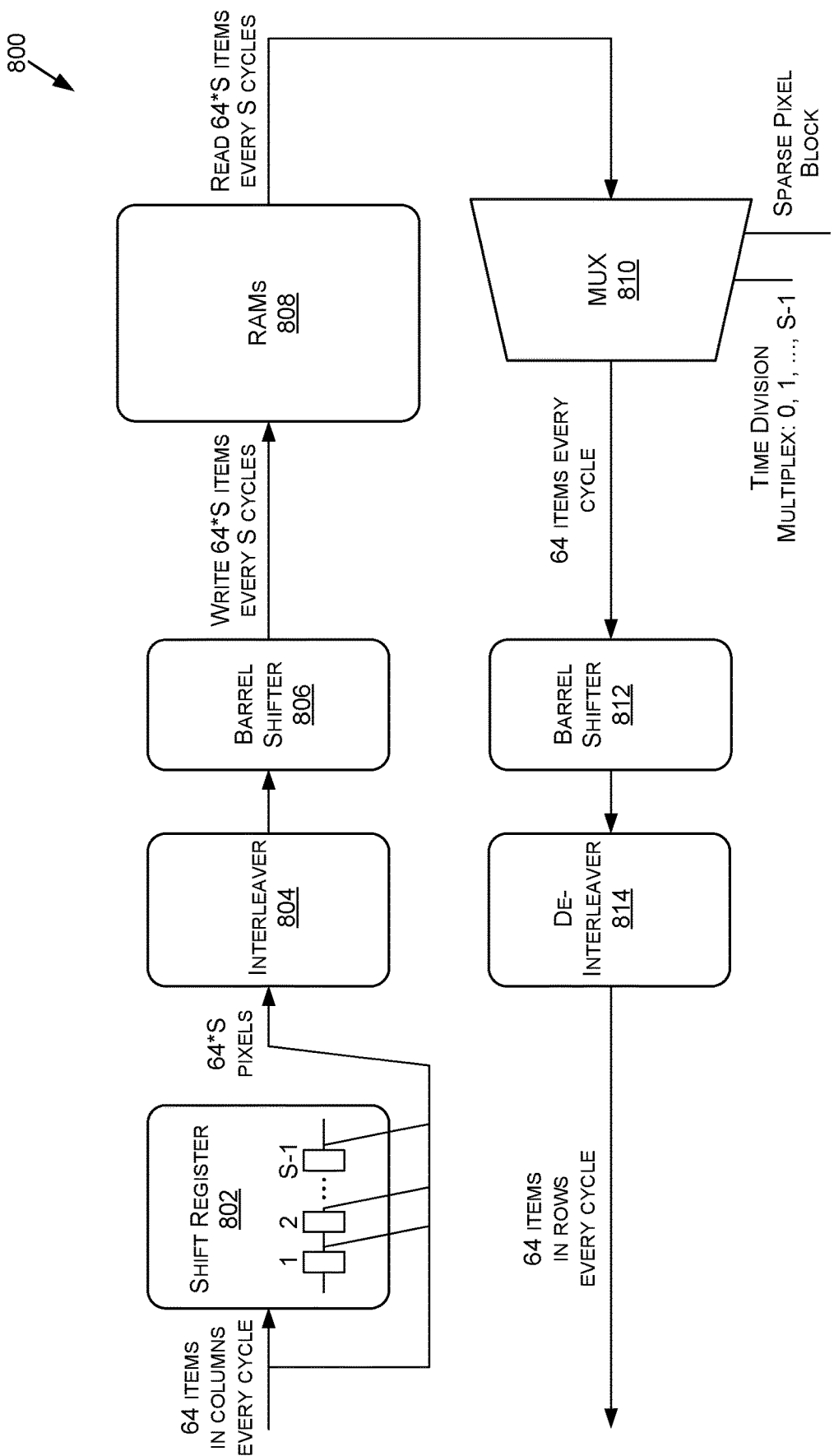
FIG. 8A includes a flow diagram of an example of a process which may be used to implement the helical memory access pattern of FIG. 6, in accordance with at least some embodiments of the present disclosure.

Using the approach discussed with the example of an 8×8 pixel block, at least 64 separate RAMs may be needed for 64×64 pixel blocks. To reduce the number of RAMs, operating constraints/assumptions for that approach may be relaxed. First, a potential solution is examined that makes use of additional storage by using a shift register of depth S on the incoming columns. Referring now to FIG. 8A, FIG. 8A includes a flow diagram of an example of a process 800 which may be used to implement the helical memory access pattern of FIG. 6, in accordance with at least some embodiments of the present disclosure. The process 800 includes a shift register 802 receiving 64 items in columns every cycle. The shift register 802 may include S−1 stages on 64 items (partial rows), where S is a power of 2 that allows the accumulation of a few columns so that multiple entries from a same row are always available when writing to RAM. An interleaver 804 may perform an interleaver permutation on 64*S items, which may be pixel block size dependent. In particular, the interleaving permutation may be used for different treatment of varying block sizes where each different pixel block size may have a different interleaving pattern. A barrel shifter 806 may receive the output of the interleaver 804 and be of a size 64/S over 64*S items in groups of S. RAMs 808, which may include 64/S RAMs, may receive 64*S items every S cycles. The address depth of the RAMs 808 may be 128/S with ping-pong, or 64/S without ping-pong with 1 word per address and a word bit width of item width*$S^2$.

A read of 64*S items may be performed every S cycles and provided to a multiplexer 810, which may be an Sx1 multiplexer on 64*S input items with an output of 64 items. A select may be provided of time division multiplex: 0, 1, . . . , S−1. The multiplexer 810 may provide 64 items every cycle to a barrel shifter 812. The barrel shifter 812 may be of size 64/S over 64 items in groups of S. A de-interleaver 814 may receive output from the barrel shifter 812 and perform a de-interleaver permutation on 64 items, which may be pixel block size dependent. In particular, the de-interleaving permutation may be used for different treatment of varying block sizes where each different pixel block size may have a different de-interleaving pattern.

Using the approach of FIG. 8A, the number of RAMs can be reduced by a factor of S. Each RAM may be written once every S cycles and read every S cycles. As a benefit, the shift register can be repurposed to do the transpose of the smaller pixel blocks, such as 16×8 or 8×16, while bypassing the RAMs 808. The process 800 of FIG. 8A may be employed for RAMs that do not have write enables. However, write enables may be used to transfer the burden of write muxing into the RAMs. Using such an approach, the RAMs 808 can be written to every cycle while the interleaver 804 and the barrel shifter 806 preceding the RAMs 800 are not magnified by a factor of S. Furthermore, the use of write enables may eliminate the need for a shift register, an example of which is described with respect to FIG. 8B. If RAMs with write enables are available, using the write enables may be superior to reducing the RAM count compared to using a shift register.

In addition to or instead of using a shift register or RAMs with write enables, another way to save on the RAMs 808 is to have a higher PPC pipeline (e.g., 64PPC) when the maximum 1D dimension is smaller (e.g., DTC32 (32<64)). Such a configuration may be constructed so that it is equivalent to having a shift register, except the shifted data is all available within a cycle directly from the pipe. In this a write may be performed every cycle and read may be performed every cycle to fully occupy the pipe with multiple columns and rows of the data. In at least one embodiment, this approach may be used to further reduce the memory count.

Figure 8B:
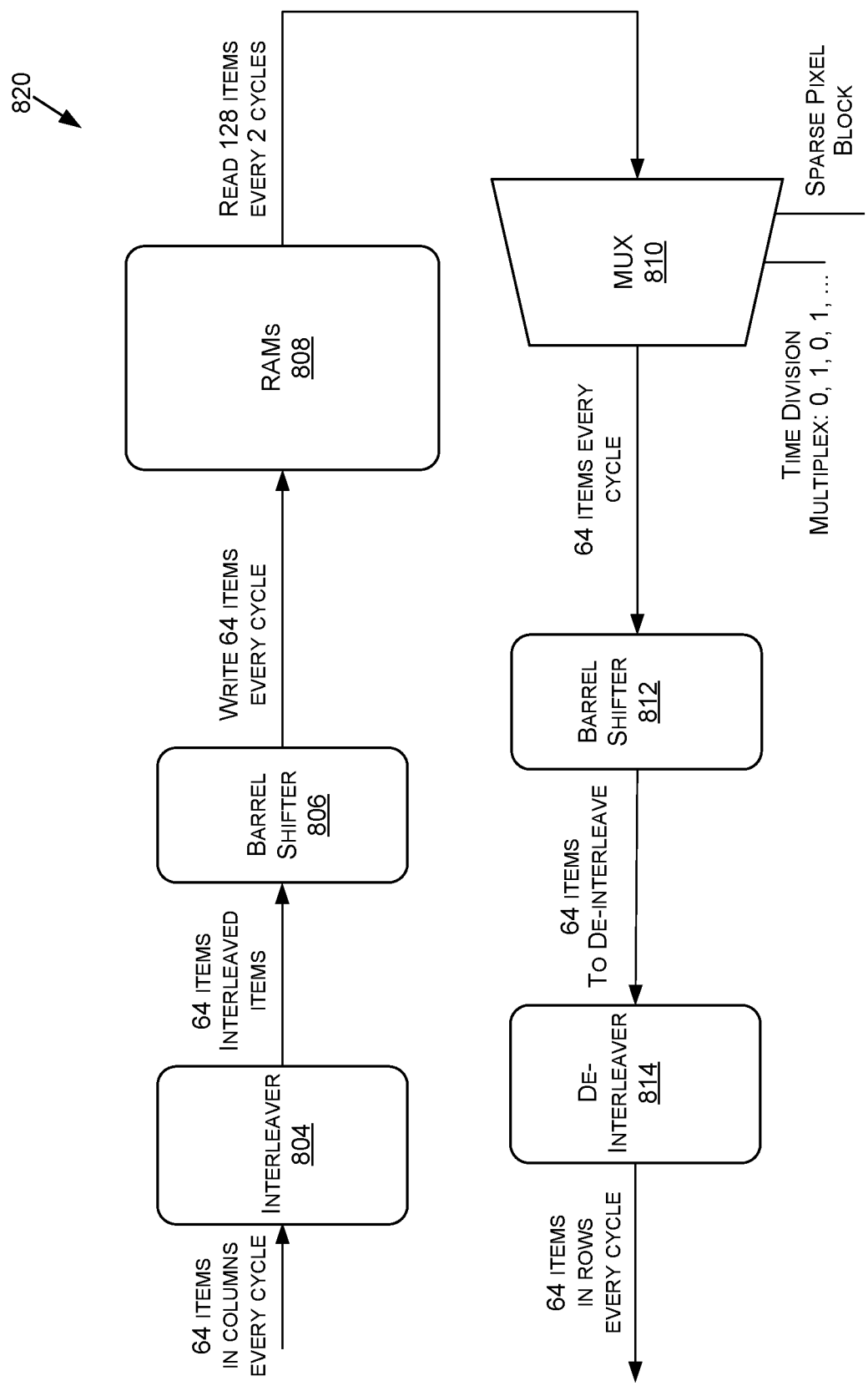
FIG. 8B includes a flow diagram of an example of a process which may be used to implement the helical memory access pattern of FIG. 6, in accordance with at least some embodiments of the present disclosure.

As described herein, the use of write enables may eliminate the need for a shift register. For example, the shift register 802 may be removed as a portion of the RAM cells of the RAMs 808 may be written at every cycle with the RAMs 808 acting as a physical shift register, such as in FIG. 8B. Referring now to FIG. 8B, FIG. 8B includes a flow diagram of an example of a process 820 which may be used to implement the helical memory access pattern of FIG. 6, in accordance with at least some embodiments of the present disclosure. The process 820 may be implemented using a buffer or super-elastic buffer and may reuse the same barrel shifter across all pixel block types. The process 820 may use a write pattern where 2 of every 4 words written to memory are always a duplicate of the other two. However, an odd and even cycle alternating pattern on the write enable inputs of the RMAs 808 may ensure that only a necessary subset of the data words get written to the addressed memory entry. The process 820 may use a read pattern that allows simple muxing of the RAM 808 output data bits on odd and even cycles for regular pixel blocks. In order to make the buffer super elastic, the same read address may be shared across all RAMs and incremented on every second cycle when a pixel block takes up more than one cycle.

The example of FIG. 8B is for S=2, where the interleaver 804 may perform an interleaver permutation on 64 items, which may be pixel block size dependent. The 64 interleaved items may be provided to the barrel shifter 806, which may be of size 32 (on the read and write side) over 64 items grouped in pairs. A write of 64 items may be performed every cycle to the RAMs 808 using an address depth of 64, 4 words per-address with write enables, and a word bit width of 20, which may be a place holder width. A read of 128 items every 2 cycles from the RAMs 808 may be performed to provide 128 inputs to the mux 810. The mux 810 may include a 2×1 mux for 32 outputs and a 3×1 mux for 32 outputs, providing 64 items every cycles. The barrel shifter 812 may be of size 32 (on the read and write side) over 64 items grouped in pairs and provide 64 items to de-interleave. The de-interleaver 814 may perform a de-interleaver permutation on the 64 items, which may be pixel block size dependent and provide 64 items in rows every cycle.

In at least one embodiment, a single pixel block may be small enough that pixels elements of the pixel block do not fill a single address in a RAM, resulting in the RAM cell being sparsely filled. Using the example of above, when S=2, 8×8 pixel blocks may be sparse pixel blocks and when S=4, 8×8, 8×16, and 16×8 pixel blocks may be sparse pixel blocks. To account for this, the read side multiplexer 810 may include a slight overhead to address these cases. For example, for S=2 a 3×1 mux may be used. The 3×1 mux may decompose into a 2×1 mux stage followed by another 2×1. The first 2×1 mux stage may select between odd and even RAM entries for non-sparse blocks and create an output N. The second 2×1 mux may bypass the first mux for odd cycles. For example, when there is no need to use two cycles to send the data that was read (as it fits in one cycle), the bypass may be used (e.g., for sparse pixel blocks). In other embodiments, a write side mux may be added on RAM input data. There may be no need to barrel shift sparse pixel blocks as they may be small enough to entirely fit in a single address across all the RAMs. As a further example, in at least one embodiment, the transpose buffer may be bypassed with sparse blocks. As the data is all available in one cycle, a transpose may be achieved by swizzling the data in one cycle (although scheduling may become harder).

Elastic Ping-Pong Buffer

The transpose unit buffer may be improved for cases where various pixel block sizes are intermixed into the pipeline by avoiding stalling the current pixel block at the input of transpose when the buffer still has high occupancy from previously sent pixel blocks. In at least one embodiment, transpose operations may be performed using an elastic ping-pong buffer that implements a FIFO-based approach, allowing for fine grain tuning of the buffer sizes between 1D transforms. In at least one embodiment, buffer sizes may be adjustable in fine grain factors of the maximum transform size supported, for example 1.375. By way of example and not limitation, buffer size factors of 1.0 (for 16 PPC/32 PPC pipes) and 2.0 (for a 64 PPC pipe) may be used to match the throughput and occupancy needed by the computational pipes for 32×32 transforms.

Using an elastic ping-pong buffer, the RAM may be divided into an address range for reading stored pixel blocks that have been completely written but have not been fully read, a write address range that consists of partially stored data for the current pixel block being written, and empty storage available for the upcoming pixel blocks. When a pixel block is completely read the pixel block may be returned to the free address range of empty storage. Using mutually exclusive ranges, may prevent a simultaneous read and write conflict to the same address. Such an approach may leverage the double address space used to store a single pixel block of the largest size to keep the RAM count lower, as described herein.

In at least one embodiment, a transpose buffer may be made elastic using read and write pointers akin to a synchronous FIFO methodology, which may be referred to as a super elastic buffer or store. Latency of a transpose buffer may be variable according to pixel block size. In a conventional ping-pong buffer there may be a penalty when changing pixel block sizes in a sequence of pixel blocks. Smaller blocks must wait for the larger block to flush out before they can proceed and only one block can be stored in each side of the ping-pong buffer. To reduce the effect of oscillating between smaller and larger sizes, disclosed approaches may take advantage the write and read address organization, described herein, which may limit all pixel blocks to be written to a restricted address space starting from 0. In at least one embodiment, until the write side buffer is completely filled, data for additional pixel blocks may be written if there is enough space remaining so long as previous pixel block data in the same buffer is not overwritten. This can be achieved by keeping a table of the pixel blocks written to be transferred over to the read side. The first pixel block in the write buffer may start at offset 0. The second may start at an offset equivalent to the address depth (AD) of the first pixel block. Any further pixel block may start at an offset equivalent to the sum of the previous pixel block's address depths.

Referring now to FIG. 9, FIG. 9 includes a table 900 illustrating an example of how pixel blocks may be stored in the same buffer using offsets. The offset may be implemented using a count maintained by the hardware. The count may correspond to a running sum of the previous pixel block's address depths. Each time a pixel block is fully written, a check may be performed to see if the read side buffer is still busy. If the check indicates the read side is not busy, the buffer may be closed for writing and transferred to the read side. As can be seen in the example, some thirty cycles may be saved on a single transpose unit. The same amount may be saved again once IDCT is processed. On the read side, each entry of the table may be fully flushed out to report non-busy. It may still be possible for the buffer to halt input on the write side if there is not enough space left in the buffer for the address depth of the incoming pixel block.

When offsets are used the buffer is acting like FIFO, in that the 4×4, 4×8, 8×4 and 8×8 blocks may go through the ping-pong buffer rather than bypass it. Otherwise these blocks may stall until the ping-pong frees up.

TABLE 7 provides a generalized offset formulation which may be employed:

| Pixel Block Size | Offset |
|---|---|
| C1xR1 | 0 |
| C2xR2 | AD(C1xR1) |
| C3xR3 | AD(C1xR1)+AD(C2xR2) |
| C4xR4 | AD(C1xR1)+AD(C2xR2)+AD(C3xR3) |
| ... | ... |
| CnxRn | AD(C1xR1)+AD(C2xR2)+...+AD(C(n−1)xR(n−1)) |

It may be provided that AD(C1xR1)+AD(C2×R2)+ . . . +AD(C(n−1)xR(n−1))+AD(CnxRn)<=AD(ExE).

The concept of read and write offsets may be expanded to read and write pointers. In accordance with at least one embodiment, instead of resetting the addresses to 0 at each pixel block, the pointer addressing scheme may be used that wraps around the address space AS of the buffer. Doing so may eliminate the need for a hard division between the two sides of the RAM. As with previous examples, the transpose buffer may still be considered a ping-pong because a pixel block is fully written (ping) before it is read in transpose format (pong). The available space in the buffer may be referred to as elastic because the buffer may not be divided into fixed sized parts where a read or a write must occur. Super elasticity may result as during the process of a pixel block being read out there is space progressively freed up for write access. A pixel block does not need to be completely read out before the pixel block storage is made free.

Figure 10:
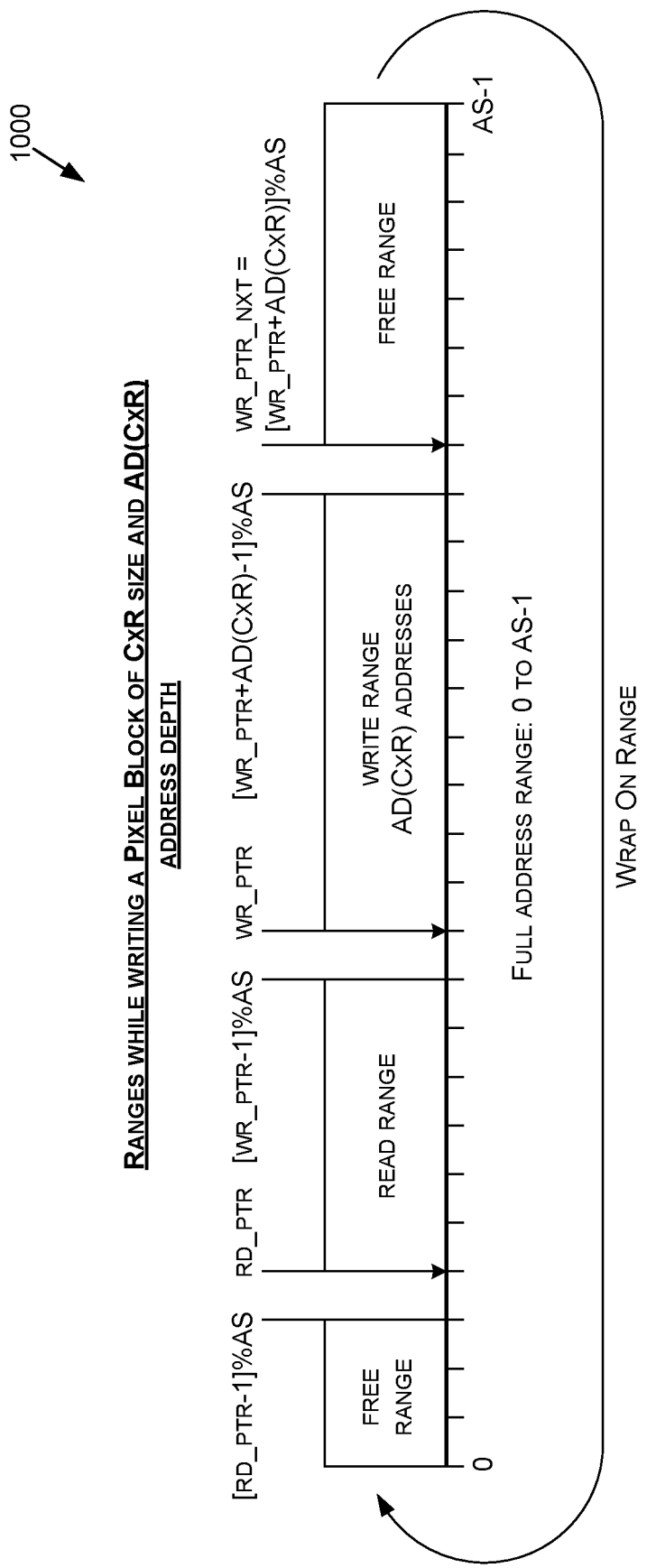
FIG. 10 illustrates an example of how an address space may be divided into a write range, a read range, and a free range, in accordance with at least some embodiments of the present disclosure.

In at least one embodiment, the pointers divide up the address space into a write range where a pixel block is being written, an empty or free range where there are entries available to be filled, and a read range where there are filled entries to be read and sent out. Referring now to FIG. 10, FIG. 10 illustrates an example of how the address space may be divided into a write range, a read range, and a free range, in accordance with at least some embodiments of the present disclosure. In FIG. 10, '%' is a modulo operator and AS refers to the address space of the RAMs. The range notation [ ]' wraps about the AS meaning [A, B] when A<B implies [A, AS−1] U [0, B].

FIG. 10 also shows examples of the pointers, which may include a write range pointer wr_ptr, a read range pointer rd_ptr, and a free range pointer wr_ptr_nxt. The write pointer wr_ptr may be advanced to the free range pointer wr_ptr_nxt when the last pixels/coefficients of a pixel block are written. Each time the physical RAM is read, the read pointer rd_ptr may be advanced. The super elastic store can get full over time, especially if there is back pressure that stalls read operations. Conversely if no data is presented to the transpose buffer then it becomes empty. Full and empty conditions may be used to control reads and writes using the buffer, and may be tracked using a bit or flag to control write and read enables during RAM operations. In at least one embodiment, an elastic ping-pong buffer, or store, may report full if the write range of an incoming pixel block overlaps a read range and the store is not empty, which means the read pointer address falls inside the write range and implies there is not enough free space for the whole pixel block to be written. In at least one embodiment, the read pointer rd_ptr being equal to the write pointer wr_ptr may indicate the buffer is either full or empty. If this state was caused by a change to the read pointer rd_ptr, this may indicate the buffer is full, as write caught up to read. Otherwise, if this state was caused by a change to the write pointer wr_ptr, this may indicate the buffer is empty, as write is lapping read.

While in the example of FIG. 6, the write operations for the 8×8 pixel block follow addresses with a helical pattern and the read addresses are uniform across all eight RAMS, this need not be true of every 8×8 being written to memory. For example, assume a sequence of 8×8 pixel blocks entering the buffer. For even 8×8 pixel blocks in the sequence, writes may be performed using a helical address pattern, and reads may be performed using a uniform address pattern, such as described with respect to FIG. 6. However, for the odd 8×8 pixel blocks entering the buffer, writes may be performed using a uniform address pattern, and reads may be performed using a helical address pattern. Thus, the read and write pattern may flip for every other pixel block entering the buffer. This scheme may only require a 1× buffer size while avoiding blocking. As soon as a column or row of data is read out, the next write can fill the entries that were just read by using the same addressing scheme that was just used for the read without waiting.

Optimizing Area, Power and Timing by Minimizing Addition Terms

As described herein, the number of half-butterflies used to implement the data flow 100 may be reduced by distributing them appropriately across the phases 208. The number of addition terms within a phase 208 may also be reduced using approaches described herein. Parameters of a phase 208 may include H, referring to the number of half-butterflies used in the phase 208, T, the number of transforms using half-butterflies within a phase 208 (AV1 and VP9 transforms of the same type may be counted separately where both are implemented), and $h_t$, where t is an index given to the transform types supported in the phase 208, where $1 \leq t \leq T$ and $h_t$ is the number of half-butterflies that transform t uses within the phase 208. It follows that $1 \leq t \leq T$ $1 \leq h_t \leq H$ and there must be at least one transform s such that $h_s = H$, otherwise the phase 208 would require fewer half-butterflies.

Given the parameters of a phase 208, the size of the space on which the addition terms are minimized may be estimated. Each shared half-butterfly circuit may include two multiplexers. One mux may select the left-side cos A of (X*cos A+Y*cos B), and the other side may select the right-side cos B. Since addition is commutative, these left and right terms can be swapped, creating many possible arrangements. If a transform requires $h_t$ half-butterflies then the left-right combinations of its terms is $2^{h_t}$. If we consider all T transforms then the possible combinations expand according to Equation (1):

$$2^{h_1} \cdot 2^{h_2} \ldots 2^{h_T} = 2^{\Sigma_{t=1}^T h_t}. \tag{1}$$

Given H half-butterflies, for a particular transform type index t a subset of $h_t$ half-butterflies may be chosen to distribute them. The number of possible subsets i may correspond to Equation (2):

$$\binom{H}{h_t} = \frac{H!}{(H-h_t)! h_t!}. \tag{2}$$

The chosen subset i of half-butterflies can be permuted in $h_t!$ ways, leaving a number of combinations for the transform that may correspond to Equation (3):

$$2^{h_t} \binom{H}{h_r} h_r! = \frac{2^{h_t} H! h_t!}{(H-h_t)! h_t!} = \frac{2^{h_t} H!}{(H-h_t)!} \tag{3}$$

To diminish the size of this space, it is possible to arbitrarily choose one of the transforms and select its half-butterflies to be fixed in the order of its half-butterflies as well as the left-right distribution of their arguments. For example, a transform may be chosen that uses the maximum number of half-butterflies H, allowing the above combinations to be divided by: $2^H H!$. This may result in a number of combinations on a given phase 208 corresponding to Equation (4):

$$\frac{2^{\Sigma_{t=1}^T h_t}}{2^H H!} \cdot \prod_{t=1}^{T} \frac{H!}{(H-h_t)!} \tag{4}$$

Given these combinations, the number of non-zero addition terms may be minimized by performing a search across the combinations. In at least one embodiment, a computer-aided design (CAD) tool for circuit design may thus implement the forgoing approach or heuristic to determine and/or reduce the number of adders.

Figure 11:
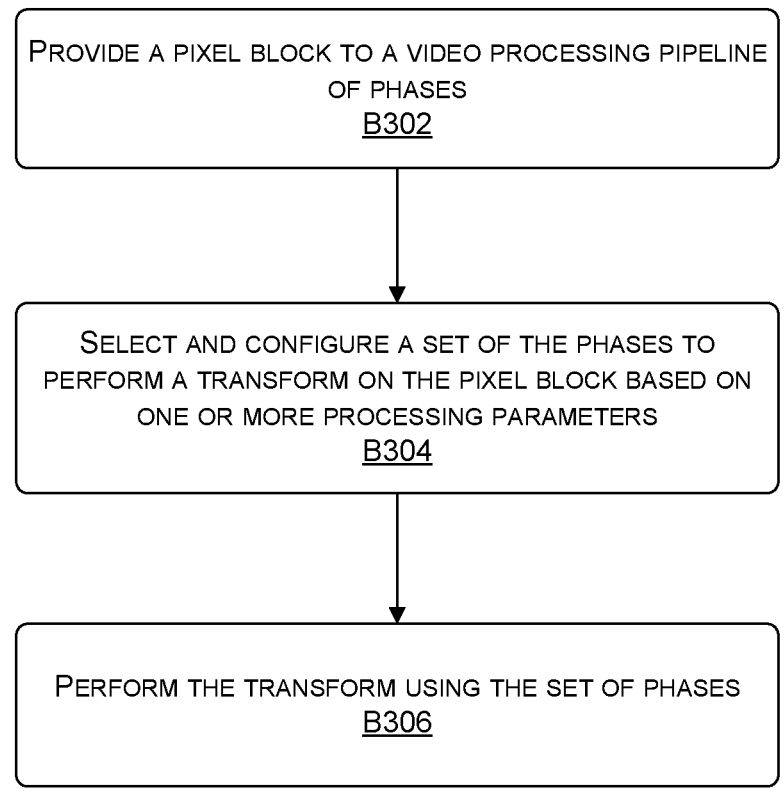
FIG. 11 is a flow diagram showing a method for operating a video processing pipeline using shared hardware resources, in accordance with some embodiments of the present disclosure.

Now referring to FIG. 11, each block of method 1100, and other methods described herein, comprises a computing process that may be performed using any combination of hardware, firmware, and/or software. For instance, various functions may be carried out by a processor executing instructions stored in memory and/or one or more circuits. The methods may also be embodied, at least partially, as computer-usable instructions stored on computer storage media. The methods may be provided by a standalone application, a service or hosted service (standalone or in combination with another hosted service), or a plug-in to another product, to name a few. The methods may additionally or alternatively be executed by any one system, or any combination of systems, including, but not limited to, those described herein.

FIG. 11 is a flow diagram showing a method 1100 for operating a video processing pipeline of phases using shared hardware resources, in accordance with some embodiments of the present disclosure. The method 1100, at block B1102, includes providing a pixel block to a video processing pipeline. For example, the scheduler 116 may provide a pixel block to an input of a quantization and transform unit implementing the data flow 100 of FIG. 1. The method 1100, at block B1104 includes selecting and configuring a set of the phases to perform a transform on the pixel block based on one or more processing parameters. For example, the configuration circuit(s) 202 may select and configure a set of the phases 208 to perform a transform on the pixel block based on one or more of the processing parameters 206. The method 1100, at block B1104 includes performing the transform using the set of the phases. For example, the quantization and transform unit may perform the transform using the set of the phases 208 selected and configured using the configuration circuit(s) 202.

Example Computing Device

Figure 12:
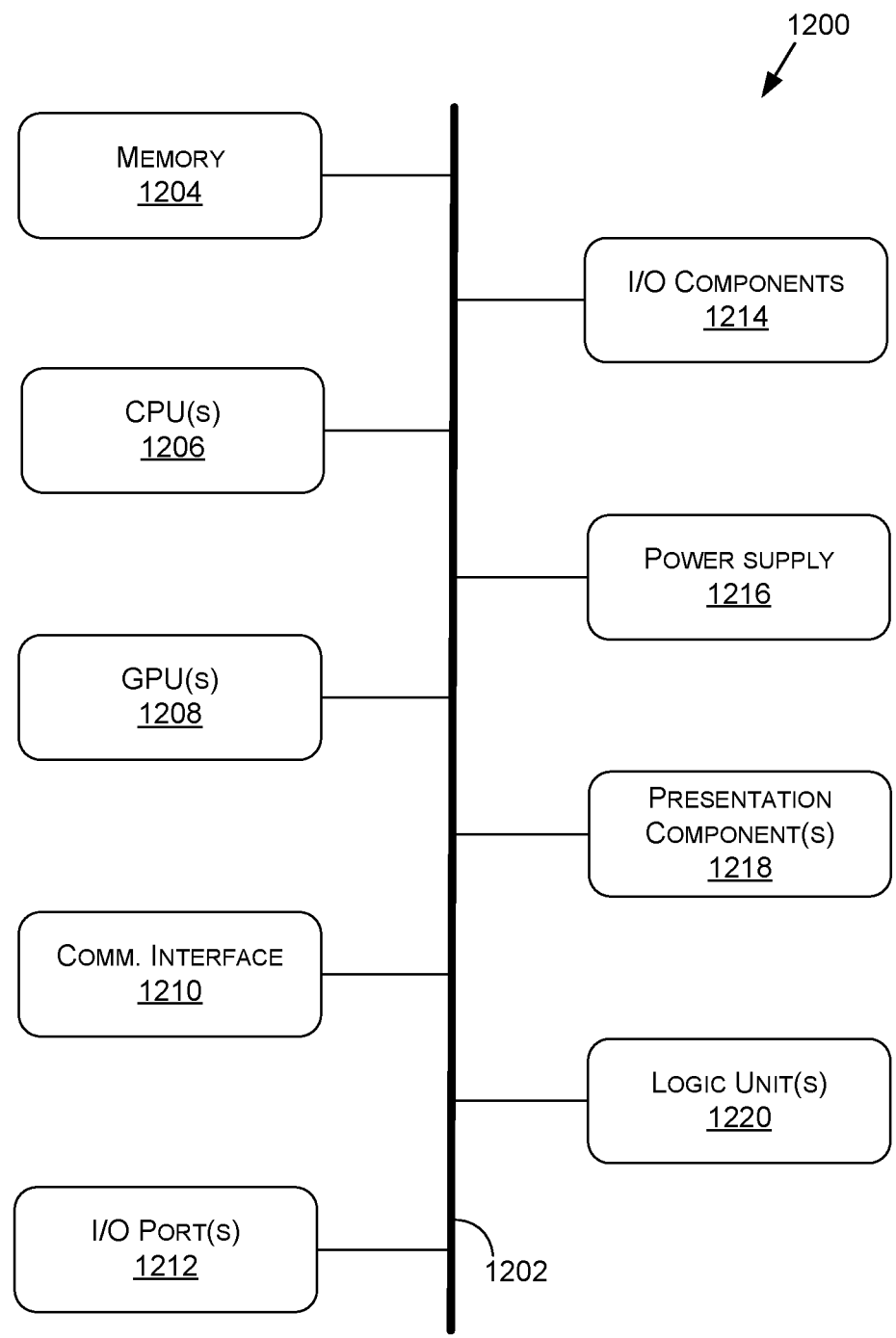
FIG. 12 is a block diagram of an example computing device(s) suitable for use in implementing some embodiments of the present disclosure.

FIG. 12 is a block diagram of an example computing device(s) 1200 suitable for use in implementing some embodiments of the present disclosure. Computing device 1200 may include an interconnect system 1202 that directly or indirectly couples the following devices: memory 1204, one or more central processing units (CPUs) 1206, one or more graphics processing units (GPUs) 1208, a communication interface 1210, input/output (I/O) ports 1212, input/output components 1214, a power supply 1216, one or more presentation components 1218 (e.g., display(s)), and one or more logic units 1220. In at least one embodiment, the computing device(s) 1200 may comprise one or more virtual machines (VMs), and/or any of the components thereof may comprise virtual components (e.g., virtual hardware components). For non-limiting examples, one or more of the GPUs 1208 may comprise one or more vGPUs, one or more of the CPUs 1206 may comprise one or more vCPUs, and/or one or more of the logic units 1220 may comprise one or more virtual logic units. As such, a computing device(s) 1200 may include discrete components (e.g., a full GPU dedicated to the computing device 1200), virtual components (e.g., a portion of a GPU dedicated to the computing device 1200), or a combination thereof.

Although the various blocks of FIG. 12 are shown as connected via the interconnect system 1202 with lines, this is not intended to be limiting and is for clarity only. For example, in some embodiments, a presentation component 1218, such as a display device, may be considered an I/O component 1214 (e.g., if the display is a touch screen). As another example, the CPUs 1206 and/or GPUs 1208 may include memory (e.g., the memory 1204 may be representative of a storage device in addition to the memory of the GPUs 1208, the CPUs 1206, and/or other components). In other words, the computing device of FIG. 12 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 12.

The interconnect system 1202 may represent one or more links or busses, such as an address bus, a data bus, a control bus, or a combination thereof. The interconnect system 1202 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 1206 may be directly connected to the memory 1204. Further, the CPU 1206 may be directly connected to the GPU 1208. Where there is direct, or point-to-point connection between components, the interconnect system 1202 may include a PCIe link to carry out the connection. In these examples, a PCI bus need not be included in the computing device 1200.

The memory 1204 may include any of a variety of computer-readable media. The computer-readable media may be any available media that may be accessed by the computing device 1200. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1204 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 1200. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 1206 may be configured to execute at least some of the computer-readable instructions to control one or more components of the computing device 1200 to perform one or more of the methods and/or processes described herein. The CPU(s) 1206 may each include one or more cores (e.g., one, two, four, eight, twenty-eight, seventy-two, etc.) that are capable of handling a multitude of software threads simultaneously. The CPU(s) 1206 may include any type of processor, and may include different types of processors depending on the type of computing device 1200 implemented (e.g., processors with fewer cores for mobile devices and processors with more cores for servers). For example, depending on the type of computing device 1200, the processor may be an Advanced RISC Machines (ARM) processor implemented using Reduced Instruction Set Computing (RISC) or an x86 processor implemented using Complex Instruction Set Computing (CISC). The computing device 1200 may include one or more CPUs 1206 in addition to one or more microprocessors or supplementary co-processors, such as math co-processors.

In addition to or alternatively from the CPU(s) 1206, the GPU(s) 1208 may be configured to execute at least some of the computer-readable instructions to control one or more components of the computing device 1200 to perform one or more of the methods and/or processes described herein. One or more of the GPU(s) 1208 may be an integrated GPU (e.g., with one or more of the CPU(s) 1206 and/or one or more of the GPU(s) 1208 may be a discrete GPU. In embodiments, one or more of the GPU(s) 1208 may be a coprocessor of one or more of the CPU(s) 1206. The GPU(s) 1208 may be used by the computing device 1200 to render graphics (e.g., 3D graphics) or perform general purpose computations. For example, the GPU(s) 1208 may be used for General-Purpose computing on GPUs (GPGPU). The GPU(s) 1208 may include hundreds or thousands of cores that are capable of handling hundreds or thousands of software threads simultaneously. The GPU(s) 1208 may generate pixel data for output images in response to rendering commands (e.g., rendering commands from the CPU(s) 1206 received via a host interface). The GPU(s) 1208 may include graphics memory, such as display memory, for storing pixel data or any other suitable data, such as GPGPU data. The display memory may be included as part of the memory 1204. The GPU(s) 1208 may include two or more GPUs operating in parallel (e.g., via a link). The link may directly connect the GPUs (e.g., using NVLINK) or may connect the GPUs through a switch (e.g., using NVSwitch). When combined together, each GPU 1208 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 1206 and/or the GPU(s) 1208, the logic unit(s) 1220 may be configured to execute at least some of the computer-readable instructions to control one or more components of the computing device 1200 to perform one or more of the methods and/or processes described herein. In embodiments, the CPU(s) 1206, the GPU(s) 1208, and/or the logic unit(s) 1220 may discretely or jointly perform any combination of the methods, processes and/or portions thereof. One or more of the logic units 1220 may be part of and/or integrated in one or more of the CPU(s) 1206 and/or the GPU(s) 1208 and/or one or more of the logic units 1220 may be discrete components or otherwise external to the CPU(s) 1206 and/or the GPU(s) 1208. In embodiments, one or more of the logic units 1220 may be a coprocessor of one or more of the CPU(s) 1206 and/or one or more of the GPU(s) 1208.

Examples of the logic unit(s) 1220 include one or more processing cores and/or components thereof, such as Data Processing Units (DPUs), Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 1210 may include one or more receivers, transmitters, and/or transceivers that enable the computing device 1200 to communicate with other computing devices via an electronic communication network, included wired and/or wireless communications. The communication interface 1210 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet. In one or more embodiments, logic unit(s) 1220 and/or communication interface 1210 may include one or more data processing units (DPUs) to transmit data received over a network and/or through interconnect system 1202 directly to (e.g., a memory of) one or more GPU(s) 1208.

The I/O ports 1212 may enable the computing device 1200 to be logically coupled to other devices including the I/O components 1214, the presentation component(s) 1218, and/or other components, some of which may be built in to (e.g., integrated in) the computing device 1200. Illustrative I/O components 1214 include a microphone, mouse, keyboard, joystick, game pad, game controller, satellite dish, scanner, printer, wireless device, etc. The I/O components 1214 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1200. The computing device 1200 may be include depth cameras, such as stereoscopic camera systems, infrared camera systems, RGB camera systems, touchscreen technology, and combinations of these, for gesture detection and recognition. Additionally, the computing device 1200 may include accelerometers or gyroscopes (e.g., as part of an inertia measurement unit (IMU)) that enable detection of motion. In some examples, the output of the accelerometers or gyroscopes may be used by the computing device 1200 to render immersive augmented reality or virtual reality.

The power supply 1216 may include a hard-wired power supply, a battery power supply, or a combination thereof. The power supply 1216 may provide power to the computing device 1200 to enable the components of the computing device 1200 to operate.

The presentation component(s) 1218 may include a display (e.g., a monitor, a touch screen, a television screen, a heads-up-display (HUD), other display types, or a combination thereof), speakers, and/or other presentation components. The presentation component(s) 1218 may receive data from other components (e.g., the GPU(s) 1208, the CPU(s) 1206, DPUs, etc.), and output the data (e.g., as an image, video, sound, etc.).

Example Data Center

Figure 13:
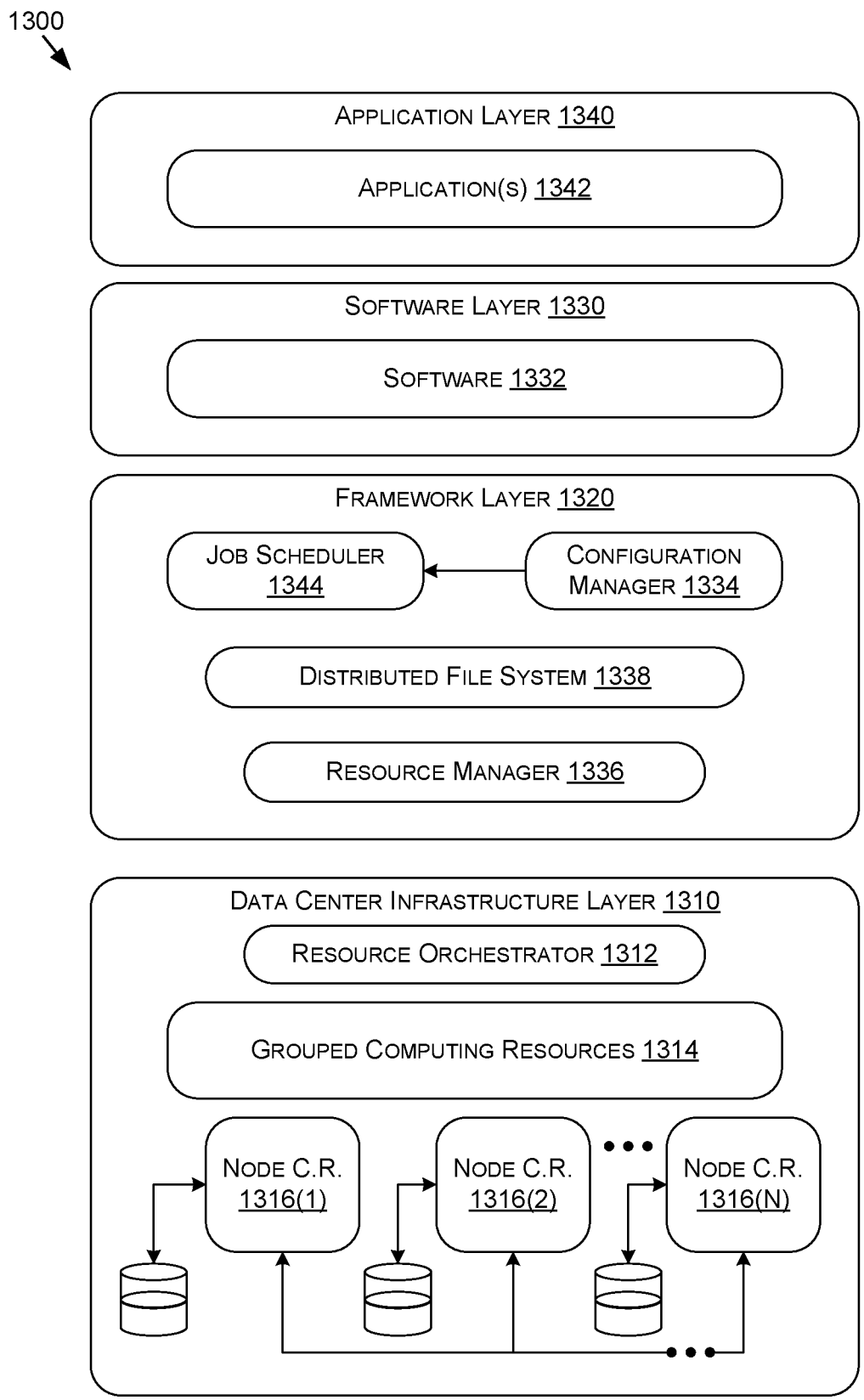
FIG. 13 is a block diagram of an example data center suitable for use in implementing some embodiments of the present disclosure.

FIG. 13 illustrates an example data center 1300 that may be used in at least one embodiments of the present disclosure. The data center 1300 may include a data center infrastructure layer 1310, a framework layer 1320, a software layer 1330, and/or an application layer 1340.

As shown in FIG. 13, the data center infrastructure layer 1310 may include a resource orchestrator 1312, grouped computing resources 1314, and node computing resources ("node C.R.s") 1316(1)-1316(N), where "N" represents any whole, positive integer. In at least one embodiment, node C.R.s 1316(1)-1316(N) may include, but are not limited to, any number of central processing units (CPUs) or other processors (including DPUs, accelerators, field programmable gate arrays (FPGAs), graphics processors or graphics processing units (GPUs), etc.), memory devices (e.g., dynamic read-only memory), storage devices (e.g., solid state or disk drives), network input/output (NW I/O) devices, network switches, virtual machines (VMs), power modules, and/or cooling modules, etc. In some embodiments, one or more node C.R.s from among node C.R.s 1316(1)-1316(N) may correspond to a server having one or more of the above-mentioned computing resources. In addition, in some embodiments, the node C.R.s 1316(1)-13161 (N) may include one or more virtual components, such as vGPUs, vCPUs, and/or the like, and/or one or more of the node C.R.s 1316(1)-1316(N) may correspond to a virtual machine (VM).

In at least one embodiment, grouped computing resources 1314 may include separate groupings of node C.R.s 1316 housed within one or more racks (not shown), or many racks housed in data centers at various geographical locations (also not shown). Separate groupings of node C.R.s 1316 within grouped computing resources 1314 may include grouped compute, network, memory or storage resources that may be configured or allocated to support one or more workloads. In at least one embodiment, several node C.R.s 1316 including CPUs, GPUs, DPUs, and/or other processors may be grouped within one or more racks to provide compute resources to support one or more workloads. The one or more racks may also include any number of power modules, cooling modules, and/or network switches, in any combination.

The resource orchestrator 1312 may configure or otherwise control one or more node C.R.s 1316(1)-1316(N) and/or grouped computing resources 1314. In at least one embodiment, resource orchestrator 1312 may include a software design infrastructure (SDI) management entity for the data center 1300. The resource orchestrator 1312 may include hardware, software, or some combination thereof.

In at least one embodiment, as shown in FIG. 13, framework layer 1320 may include a job scheduler 1344, a configuration manager 1334, a resource manager 1336, and/or a distributed file system 1338. The framework layer 1320 may include a framework to support software 1332 of software layer 1330 and/or one or more application(s) 1342 of application layer 1340. The software 1332 or application(s) 1342 may respectively include web-based service software or applications, such as those provided by Amazon Web Services, Google Cloud and Microsoft Azure. The framework layer 1320 may be, but is not limited to, a type of free and open-source software web application framework such as Apache Spark™ (hereinafter "Spark") that may utilize distributed file system 1338 for large-scale data processing (e.g., "big data"). In at least one embodiment, job scheduler 1344 may include a Spark driver to facilitate scheduling of workloads supported by various layers of data center 1300. The configuration manager 1334 may be capable of configuring different layers such as software layer 1330 and framework layer 1320 including Spark and distributed file system 1338 for supporting large-scale data processing. The resource manager 1336 may be capable of managing clustered or grouped computing resources mapped to or allocated for support of distributed file system 1338 and job scheduler 1344. In at least one embodiment, clustered or grouped computing resources may include grouped computing resource 1314 at data center infrastructure layer 1310. The resource manager 1336 may coordinate with resource orchestrator 1312 to manage these mapped or allocated computing resources.

In at least one embodiment, software 1332 included in software layer 1330 may include software used by at least portions of node C.R.s 1316(1)-1316(N), grouped computing resources 1314, and/or distributed file system 1338 of framework layer 1320. One or more types of software may include, but are not limited to, Internet web page search software, e-mail virus scan software, database software, and streaming video content software.

In at least one embodiment, application(s) 1342 included in application layer 1340 may include one or more types of applications used by at least portions of node C.R.s 1316(1)-1316(N), grouped computing resources 1314, and/or distributed file system 1338 of framework layer 1320. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more embodiments.

In at least one embodiment, any of configuration manager 1334, resource manager 1336, and resource orchestrator 1312 may implement any number and type of self-modifying actions based on any amount and type of data acquired in any technically feasible fashion. Self-modifying actions may relieve a data center operator of data center 1300 from making possibly bad configuration decisions and possibly avoiding underutilized and/or poor performing portions of a data center.

The data center 1300 may include tools, services, software or other resources to train one or more machine learning models or predict or infer information using one or more machine learning models according to one or more embodiments described herein. For example, a machine learning model(s) may be trained by calculating weight parameters according to a neural network architecture using software and/or computing resources described above with respect to the data center 1300. In at least one embodiment, trained or deployed machine learning models corresponding to one or more neural networks may be used to infer or predict information using resources described above with respect to the data center 1300 by using weight parameters calculated through one or more training techniques, such as but not limited to those described herein.

In at least one embodiment, the data center 1300 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing device(s) 1200 of FIG. 12—e.g., each device may include similar components, features, and/or functionality of the computing device(s) 1200. In addition, where backend devices (e.g., servers, NAS, etc.) are implemented, the backend devices may be included as part of a data center 1300, an example of which is described in more detail herein with respect to FIG. 13.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 1200 described herein with respect to FIG. 12. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A processing circuit comprising:
    a video processing pipeline of phases, each phase having a respective plurality of half-butterfly (HB) circuits, wherein the phases are selectable and configurable to perform transforms for a plurality of transform types on pixel blocks of a plurality of sizes using the HB circuits, and each transform is performed by a sequential pass through at least two phases of the phases; and
    configuration circuitry to select and configure each phase of the at least two phases to perform different operations of different stages of different transforms of the transforms based at least on thedifferent transforms being of different transform types.

2. The processing circuit of claim 1, wherein the different transform types include at least two of a discrete cosine transform (DCT), an identify transform (IDT), an asymmetric discrete sine transform (ADST), or a flip ADST.

3. The processing circuit of claim 1, wherein the configuration circuitry is further to configure the phase to perform the different operations for different bit depths and different coding formats of the different transforms.

4. The processing circuit of claim 1, wherein the configuration circuitry is further to configure one or more different clamping ranges of outputs of one or more of the phases to perform the different transforms based at least on the different transforms being associated with different coding formats and different bit depths.

5. The processing circuit of claim 1, wherein the configuration circuitry is further to configure different rounding positions of outputs of one or more of the phases to perform the different transforms based at least on the different transforms being associated with different bit depths.

6. The processing circuit of claim 1, wherein the video processing pipeline includes:
    a transform circuit to perform a forward transform on the pixel blocks, wherein one or more rate-distortion optimization costs are computed from data in a frequency domain, the data corresponding to output of the forward transform;
    a funnel circuit to filter out one or more of the pixel blocks prior to an inverse transform circuit of the video processing pipeline based at least on one or more dimensions of the pixel blocks;
    the inverse transform circuit to perform an inverse transform on a subset of the pixel blocks based on the subset passing the filtering by the funnel circuit, the inverse transform performed at a lower throughput than the forward transform; and
    an intra-frame prediction circuit to perform intra-frame predication using feedback corresponding to an output of the inverse transform.

7. The processing circuit of claim 1, wherein the transforms are performed using pre-computed trigonometric coefficients.

8. The processing circuit of claim 1, wherein the transform is an asymmetric discrete sine transform or an identify transform mapped to the plurality of HB of one or more of the phases.

9. The processing circuit of claim 1, wherein the video processing pipeline includes:
    an adder clamp to generate first one or more overflow signals based at least on clamping one or more computations of the different transforms; and
    a round-shift clamp to generate second one or more overflow signals based at least on rounding an output of the different transforms, wherein the video processing pipeline is to generate an interrupt based at least on the first one or more overflow signals and the second one or more overflow signals.

10. The processing circuit of claim 1, wherein configuration circuitry includes a plurality of one-hot multiplexors with selection sources corresponding to one or more different pixel size dimensions of the different transforms and the different transform types of the different transforms to perform the selection and configuration of the phase.

11. The processing circuit of claim 1, wherein the configuration circuitry is to bypass one or more ingress or egress phases of the phases based at least on a size of the pixel block.

12. The processing circuit of claim 1, comprising a scheduler configured to provide the pixel blocks to the video processing pipeline in an order corresponding to sizes of the pixel blocks, wherein the sizes primarily increase along the order.

13. The processing circuit of claim 1, wherein the transforms are applied without using true multipliers.

14. A method comprising:
    providing a pixel block to an input of a video processing pipeline of phases, each phase having a respective plurality of half-butterfly (HB) circuits, wherein the phases are selectable and configurable to perform transforms for a plurality of transform types on pixel blocks of a plurality of sizes using the HB circuits, and each transform is performed by a sequential pass through at least two phases of the phases;

selecting and configuring, using a configuration circuitry, each phase of the at least two phases to perform different operations of different stages of different transforms of the transforms based at least on the different transforms being of different transform types; and performing each transform of the different transforms using the at least two phases selected and configured for the transform using the configuration circuitry.

15. The method of claim 14, wherein the video processing pipeline includes a transpose circuit having an elastic ping-pong buffer to store at least a portion of the pixel block concurrently with at least a portion of a different pixel block of the pixel blocks.

16. The method of claim 14, wherein the video processing pipeline includes a transpose circuit to perform helical memory read and write patterns to perform transpose operations of the transform using interleaving, de-interleaving, and barrel shifting.

17. The method of claim 14, wherein a quantity of random-access memories (RAMs) used to process a transpose of the transform is less than one or more dimensions of the pixel block, and the transpose includes writing to a portion of the RAMs at a first cycle rate using a shift register and reading from the RAMs using time multiplexing at a second cycle rate that corresponds to a depth of the shift register.

18. The method of claim 14, wherein a pixels-per-clock (PPC) of the video processing pipeline is higher than a maximum 1D dimension of the transform types supported by the video processing pipeline such that a write to random-access memories (RAMs) used to process a transpose of the transform may be performed every cycle and a read from the RAMs may be performed every cycle to occupy the RAMs with multiple columns and rows of one or more of the pixel blocks.

19. The method of claim 14, wherein random-access memories (RAMs) used to process a transpose of the transform are provided an alternating pattern on of write enable inputs to write to a portion of the RAMs at a first cycle rate, and read from the RAMs using time multiplexing at a second cycle rate.

20. The method of claim 19, comprising alternating between a first read/write pattern of writing to random-access memories (RAMs) used to process the transpose using a helical address pattern and reading from the RAMs using a uniform address pattern, and a second read/write pattern of writing to the RAMs using a uniform address pattern and reading from the RAMs using a helical address pattern.

21. The method of claim 14, comprising:
performing a forward transform on the pixel blocks, wherein one or more rate-distortion optimization costs are computed from data in a frequency domain, the data corresponding to output of the forward transform;

filtering out one or more of the pixel blocks prior to an inverse transform circuit of the video processing pipeline based at least on one or more dimensions of the pixel blocks;

performing an inverse transform on a set of the pixel blocks based on passing the filtering, the inverse transform performed at a lower throughput than the forward transform; and performing intra-frame predication using feedback corresponding to an output of the inverse transform.

22. The method of claim 14, wherein a quantity of addition terms included within at least one phase of the phases is estimated based at least on minimizing non-zero addition terms of a transform type based at least on left-right combinations of the addition terms of the transform type, wherein the transform type has a maximum number of HBs of the plurality of transform types supported by the phase.

23. A system comprising:
a forward transform circuit having first phases, each first phase having a first respective plurality of half-butterfly (HB) circuits, wherein the first phases are selectable and configurable to perform forward transforms for a plurality of transform types on pixel blocks of a plurality of sizes using the first HB circuits, and each forward transform is performed by a sequential pass through at least two phases of the first phases;

an inverse transform circuit having second phases, each second phase having a second respective plurality of HB circuits, wherein the second phases are selectable and configurable to perform inverse transforms on at least some of the pixel blocks using the second HB circuits, and each inverse transform is performed by a sequential pass through at least two phases of the second phases; and one or more configuration circuits to select and configure each phase of the at least two phases for the forward transform and each phase of the at least two phases for the inverse transform to perform different operations of different stages of different transforms of the transforms based at least on the different transforms being of different transform types.

24. The system of claim 23, wherein the inverse transform circuit is to perform the inverse transform on a subset of the pixels blocks based at least on sizes of the pixel blocks.

25. The system of claim 23, wherein the inverse transform circuit performs the inverse transforms at a lower throughput than the forward transform circuit.

26. The system of claim 23, wherein each HB circuit of the second respective plurality of HB circuits of each phase of at least the second phases has a respective minimum bit width needed to support bit precision specified by one or more coding formats for each of the plurality of transform types.

* * * * *